(12) United States Patent
Miyazawa et al.

(10) Patent No.: US 6,980,068 B2
(45) Date of Patent: Dec. 27, 2005

(54) SYSTEM FOR AND METHOD OF INTERCONNECTING HIGH-FREQUENCY TRANSMISSION LINES

(75) Inventors: Yasunori Miyazawa, Sendai (JP); Katsuji Kaminishi, Sendai (JP)

(73) Assignee: Ryowa Electronics Co., Ltd., Miyagi-ken (JP)

( * ) Notice: Subject to any disclaimer, the term of this patent is extended or adjusted under 35 U.S.C. 154(b) by 198 days.

(21) Appl. No.: 10/373,067

(22) Filed: Feb. 26, 2003

(65) Prior Publication Data

US 2003/0164244 A1     Sep. 4, 2003

(30) Foreign Application Priority Data

Mar. 1, 2002    (JP) .............................. 2002-056400

(51) Int. Cl.[7] .............................. H01P 3/08; H01P 1/04
(52) U.S. Cl. .................... 333/260; 333/33; 333/246
(58) Field of Search ............................... 333/246, 260, 333/33, 34

(56) References Cited

U.S. PATENT DOCUMENTS 3,201,721 A    8/1965    Voelcker ..................... 333/33
5,923,234 A *  7/1999    Holzman et al. ........... 333/238
6,617,946 B2 * 9/2003    Kennedy et al. ............ 333/246

FOREIGN PATENT DOCUMENTS

| EP | 0 347 316 | 12/1989 |
| EP | 1 154 514 A2 | 11/2001 |
| JP | 2001-102817 | 4/2001 |

OTHER PUBLICATIONS

NOTE: An English language abstract of the above Japanese citation is provided to serve as a partial translation thereof.
Copending U.S. Appl. No. 10/355,092 filed Jan. 31, 2003 by Yasunori Miyazawa et al.

* cited by examiner

Primary Examiner—Stephen E. Jones
(74) Attorney, Agent, or Firm—Paul A. Guss

(57) ABSTRACT

A cut via is formed in an end of a multilayer circuit board of the first transmission line, and a clearance is provided between the cut via and a ground pattern for achieving an impedance matching between the first and second transmission lines. The cut via of a first transmission line which may be a stripline or a microstrip line, and an electrode of the second transmission line are connected to each other, and ground patterns of the first and second transmission lines are connected to each other. The first and second transmission lines have respective signal lines positioned substantially coaxially with each other.

2 Claims, 26 Drawing Sheets

PRIOR ART

PRIOR ART

PRIOR ART

PRIOR ART

SYSTEM FOR AND METHOD OF INTERCONNECTING HIGH-FREQUENCY TRANSMISSION LINES

BACKGROUND OF THE INVENTION

1. Field of the Invention

The present invention relates to a system for and a method of interconnecting a first high-frequency transmission line such as a multilayer circuit board having a stripline or a microstrip line, for example, and a second high-frequency transmission line such as a coaxial cable or a multilayer circuit board, for example, while providing a good impedance matching therebetween.

2. Description of the Related Art

The recent technological advances in IT (Information Technology) have resulted in a massive growth of information communication networks processing electric signals in a frequency range from several hundreds MHz to GHz. For example, radio waves in the GHz frequency band are used by information and communication devices and instruments such as cellular phones and wireless LAN (Local Area Network) terminals and the ITS (Intelligent Transportation System). To meet increasing demands for more and more radio waves for many different kinds of communication devices, these devices and instruments are expanded by higher frequencies from several GHz to ten GHz and higher.

For interconnecting parts inside high-frequency devices and/or instruments and also interconnections between high-frequency devices and instruments, it is necessary to connect two different high-frequency transmission lines to each other at many locations.

High-frequency devices and instruments or high-frequency transmission lines on multilayer circuit boards are interconnected usually by high-frequency coaxial connectors for input/output of signals. However, using high-frequency coaxial connectors tends to increase the system cost.

FIG. 23 of the accompanying drawings shows in exploded perspective a connection structure according to prior art 1 for interconnecting a coaxial cable 6 and a multilayer circuit board 2 having a stripline thereon without any coaxial connector in use, as disclosed in Japanese laid-open patent publication No. 2001-102817.

In FIG. 23, the multilayer circuit board 2 has conductive layers shown shaded. In some of the accompanying drawings, all conductive layers of circuit boards are shown shaded for distinguishing themselves clearly.

FIG. 24 of the accompanying drawings shows in perspective, partly broken away, a portion of the connection structure illustrated in FIG. 23.

In FIGS. 23 and 24, a central conductor 8 of a coaxial cable 6 is inserted into a via hole 4 in a multilayer circuit board 2 having a triplate stripline disposed thereon, and electrically connected to the via hole 4 by a solder body 10. The multilayer circuit board 2 has an upper ground pattern (ground conductor) 12 electrically connected to an outer conductor 14 of the coaxial cable 6 by a solder body 16. The multilayer circuit board 2 also has a lower ground pattern 20 electrically connected to the upper ground pattern 12 by a ground via hole 22.

The term "via hole" used herein means a plated through hole with lands, interconnecting conductive layers of a multilayer circuit board.

With the connection structure shown in FIGS. 23 and 24, the central conductor 8 of the coaxial cable 6 and a signal conductor 24 which serves as a signal line of the multilayer circuit board 2 are electrically connected to each other, and the outer conductor 14 of the coaxial cable 6 and the ground patterns 12, 20 of the multilayer circuit board 2 are electrically connected to each other.

FIG. 25 of the accompanying drawings shows in exploded perspective a connection structure according to prior art 2 for interconnecting a coaxial cable 6 and a multilayer circuit board 32 having a microstrip line thereon without any coaxial connector in use.

FIG. 26 of the accompanying drawings shows in perspective, partly broken away, a portion of the connection structure illustrated in FIG. 25.

As shown in FIGS. 25 and 26, a strip end of a central conductor 8 of a coaxial cable 6 is electrically connected by a solder body 36 to the pattern of a signal conductor 34 of a multilayer circuit board 32. The multilayer circuit board 32 has a ground pattern 38 electrically connected to an outer conductor 14 of the coaxial cable 6 by a solder body 16. The multilayer circuit board 2 also has another ground pattern 40 electrically connected to the ground pattern 38 by ground via holes 42.

According to the prior art 1 and the prior art 2, no expensive coaxial connector is used to interconnect the coaxial cable 6 and the signal conductor 24 and the ground 12 of the multilayer circuit board 2 or the coaxial cable 6 and the signal conductor 34 and the ground 38 of the multilayer circuit board 32.

However, the high-frequency transmission line connecting systems according to the prior art 1 and the prior art 2 have various problems as described below.

First, the high-frequency transmission line connecting system according to the prior art 1 shown in FIGS. 23 and 24 has the following drawbacks:

Since the central conductor 8 of the coaxial cable 6 needs a certain length of its bare wire strip to be soldered, the bare wire strip holds a large stray inductance which leads to an impedance mismatch, and also causes a large reflection loss.

Because the multilayer circuit board 2 has the via hole 4 in which the central conductor 8 of the coaxial cable 6 is inserted, a large stray capacitance is also formed between the via hole 4 and the ground patterns in the vicinity of the via hole 4. The large stray capacitance also leads to an impedance mismatch and gives rise to a large reflection loss.

The central conductor 8 of the coaxial cable 6 should be bent at a right angle for insertion into the via hole 4. Therefore, it is likely for the central conductor 8 to reveal a various different bending shape. It is also difficult to keep the bare wire strip of the central conductor 8 constant in length in mounting the coaxial cable 6 on the multilayer circuit board 2. As a result, it is difficult to keep the connection between the coaxial cable 6 and the multilayer circuit board 2 in constant physical configuration and to keep constant electrical characteristics. Stated otherwise, skill and expertise are required to make the connection between the coaxial cable 6 and the multilayer circuit board 2 in constant physical configuration.

Similarly, the central conductor 8 and the via hole 4 need to be soldered with skill and expertise because the space available for soldering is not enough.

The coaxial cable 6, because of its cylindrical shape, is free to move on the flat surface of the multiplayer circuit board 2. Therefore, there is difficulty in positioning and soldering the coaxial cable 6. It is also difficult to keep the connection between the coaxial cable 6 and the multilayer circuit board 2 in a uniform interconnection quality. The fixation of the coaxial cable 6 is relatively weak in mechanical strength.

The connection structure according to the prior art 1 can be used within a frequency range of at least several GHz.

The high-frequency transmission line connecting system according to the prior art 2 has had the following disadvantages:

As there is no via hole in the multilayer circuit board 32, any stray capacitance produced by the connection structure is much smaller than with the prior art 1, allowing an impedance matching to be achieved with greater ease. However, since solder is used to connect the central conductor 8 and the signal conductor 34 to each other without any fixing mechanism, intricate workmanship is required to apply an appropriate amount of solder to an appropriate area for making reliable and economical solder joints. Stated otherwise, the efficiency with which the connection structure is assembled is low, and the time required to assemble the connection structure is long, resulting in a reduced yield.

According to the prior art 2, as with the prior art 1, inasmuch as the coaxial cable 6 is required to be positioned on and fixed to the flat surface of the multilayer circuit board 2, difficulty has been encountered in positioning and soldering the coaxial cable 6, making it difficult to maintain a uniform interconnection quality. Furthermore, because the central conductor 8 is soldered to the signal conductor 34 of the multilayer circuit board 32, the fixation of the central conductor 8 soldered to the signal conductor 34 is of relatively weak mechanical strength.

SUMMARY OF THE INVENTION

It is therefore an object of the present invention to provide a system for and a method of interconnecting first and second high-frequency transmission lines inexpensively, simply, and accurately with a strong mechanical connection, while achieving a good impedance matching in a wide frequency range in excess of 10 GHz at the junction therebetween, according to a highly reproducible connecting technique (fixing technique) which is suitable for realizing excellent high-frequency characteristics. The highly reproducible technique refers to a process of achieving stably a uniform interconnection quality in repeated cycles of connecting first and second transmission lines.

According to the present invention, there is provided a system for electrically interconnecting high-frequency transmission lines, comprising a first transmission line comprising a multilayer circuit board having a ground pattern and a first signal line which jointly make up a stripline or a microstrip line, and a second transmission line having a second signal line and an electrode electrically connected to the second signal line, the first transmission line having a cut via defined in an end thereof and connected to the first signal line of the stripline or the microstrip line, the cut via formed by cutting a via hole, the first transmission line having a clearance defined between the cut via and the ground pattern for providing an impedance matching between characteristic impedances of the first and second transmission lines, the cut via of the first transmission line and the electrode of the second transmission line being connected to each other, the first and second transmission lines having ground conductors connected to each other.

As described above, the cut via is connected to the first signal line, is defined in the end of the multilayer circuit board, and the clearance is defined between the cut via and the ground pattern for providing an impedance matching between characteristic impedances of the first and second transmission lines. The cut via of the first transmission line and the electrode of the second transmission line are connected to each other, and the ground conductors of the first and second transmission lines are connected to each other.

With the above arrangement, it is possible to achieve a good impedance matching at the junction between the first and second transmission lines in a wide frequency range in excess of 10 GHz.

The ground pattern disposed outside of the above clearance forms sleeves spaced a distance from each other and extending outwardly with the cut via disposed therebetween.

The second transmission line can be inserted into a gap between the sleeves. The sleeves allow the signal lines of the first and second transmission lines to be positioned co-lineally with each other, and also can serve as a alignment guide for the common direction in which the first and second transmission lines are to be connected.

If the second transmission line comprises a coaxial cable having an outer conductor and a central conductor disposed therein as the second signal line, then the width of the gap may equal to a value corresponding to the diameter of the outer conductor to fit to the sleeves. The central conductor has a short wire strip serving as the electrode being connected to the cut via, and the outer conductor being inserted in the gap between the sleeves is bonded directly to the sleeves With the above arrangement, the central conductor of the coaxial cable and the first signal line of the first transmission line can reliably be positioned in co-linear alignment with each other.

The short wire strip of the central conductor of the coaxial cable can be of a small length and size, minimizing stray inductance and reducing stray capacitance in the vicinity of the cut via. Therefore, a better impedance matching is achieved between the first and second transmission lines, and any reflection loss between the first and second transmission lines is reduced.

As the central conductor of the coaxial cable does not need to be bent over, no special skill is required to connect the first and second transmission lines. Since a surrounding area available for connecting the first and second transmission lines therein is broad, the junction process between the first and second transmission lines keeps uniform, but does not vary from work to work, resulting in a uniform interconnection quality. Since the coaxial cable only needs to be placed at a center between the sleeves on the end of the multilayer circuit board, the coaxial cable can be positioned with ease, and the outer conductor thereof can easily and tightly be fixed to the sleeves, i.e., the multilayer circuit board.

The system further comprises two conductive fittings interconnecting the outer conductor of the coaxial cable and the ground pattern of the first transmission line, the conductive fittings being disposed respectively on upper and lower sides of a multilayer board including the first transmission line and pressed against and held in contact with respective portions of the outer conductor, and being connected to the ground pattern of the first transmission line. The fixation of the coaxial cable as the second transmission line to the first transmission line is of more increased mechanical strength.

If the second transmission line comprises a multilayer circuit board having a ground pattern and the second signal line which jointly make up a stripline or a microstrip line, then the second signal line has a via hole defined in an end thereof, and the second transmission line has a clearance defined between the via hole and the ground pattern for providing an impedance matching between characteristic impedances of the first and second transmission lines. The electrode comprises a terminal post inserted in the via hole.

The first transmission line is positioned on the second transmission line such that the cut via has an inner wall facing and contacting an outer circumferential surface of the electrode, the electrode and the inner wall of the cut via being connected to each other.

With the above arrangement, the multilayer circuit boards, each having a stripline or a microstrip line, can be connected to each other efficiently and inexpensively with a good impedance matching.

The ground pattern of the second transmission line has a ground terminal post, and the first transmission line has a ground cut via defined in an end thereof in which the cut via is defined therein. The ground cut via has a recess shaped complementarily to an outer circumferential surface of the ground terminal post. The first transmission line is positioned on the second transmission line such that the cut via has an inner wall facing and contacting an outer circumferential surface of the electrode, the electrode and the inner wall of the cut via being connected to each other. The first transmission line is also positioned on the second transmission line such that the ground cut via has a recess facing and contacting an outer circumferential surface of the ground terminal post, the ground terminal post and an inner wall of the ground cut via being connected to each other. With the above arrangement, the multilayer circuit boards of the first and second transmission lines can be positioned with respect to each other more easily for higher efficiency.

The system further comprises an elastic member for holding the ground patterns and the signal lines of the first and second transmission lines connected under elastic forces thereof in connecting the first transmission line to the second transmission line. Thus, no soldering is required to connect the ground patterns and the signal lines of the first and second transmission lines.

Preferably, the system further comprises a bump disposed between the ground pattern of the first transmission line and the ground pattern of the second transmission line confronting thereto, for determining a position in which the ground patterns are connected to each other and reducing contact resistance between the ground patterns.

According to the present invention, there is also provided a method of interconnecting high-frequency transmission lines in a system for electrically interconnecting high-frequency transmission lines including a first transmission line comprising a multilayer circuit board having a ground pattern and a first signal line which jointly make up a stripline or a microstrip line, and a second transmission line having a second signal line and an electrode electrically connected to the second signal line, the method comprising the steps of defining a cut via in an end of the first transmission line, the cut via being connected to the first signal line of the stripline or the microstrip line, the cut via serving as an electrode comprising a portion of a via hole, providing a clearance defined between the cut via and the ground pattern for providing an impedance matching between characteristic impedances of the first and second transmission lines, and connecting the cut via of the first transmission line and the electrode of the second transmission line to each other, and connecting ground conductors of the first and second transmission lines to each other.

The above method makes it possible to achieve a good impedance matching at the junction between the first and second transmission lines in a wide frequency range in excess of 10 GHz.

The above and other objects, features, and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
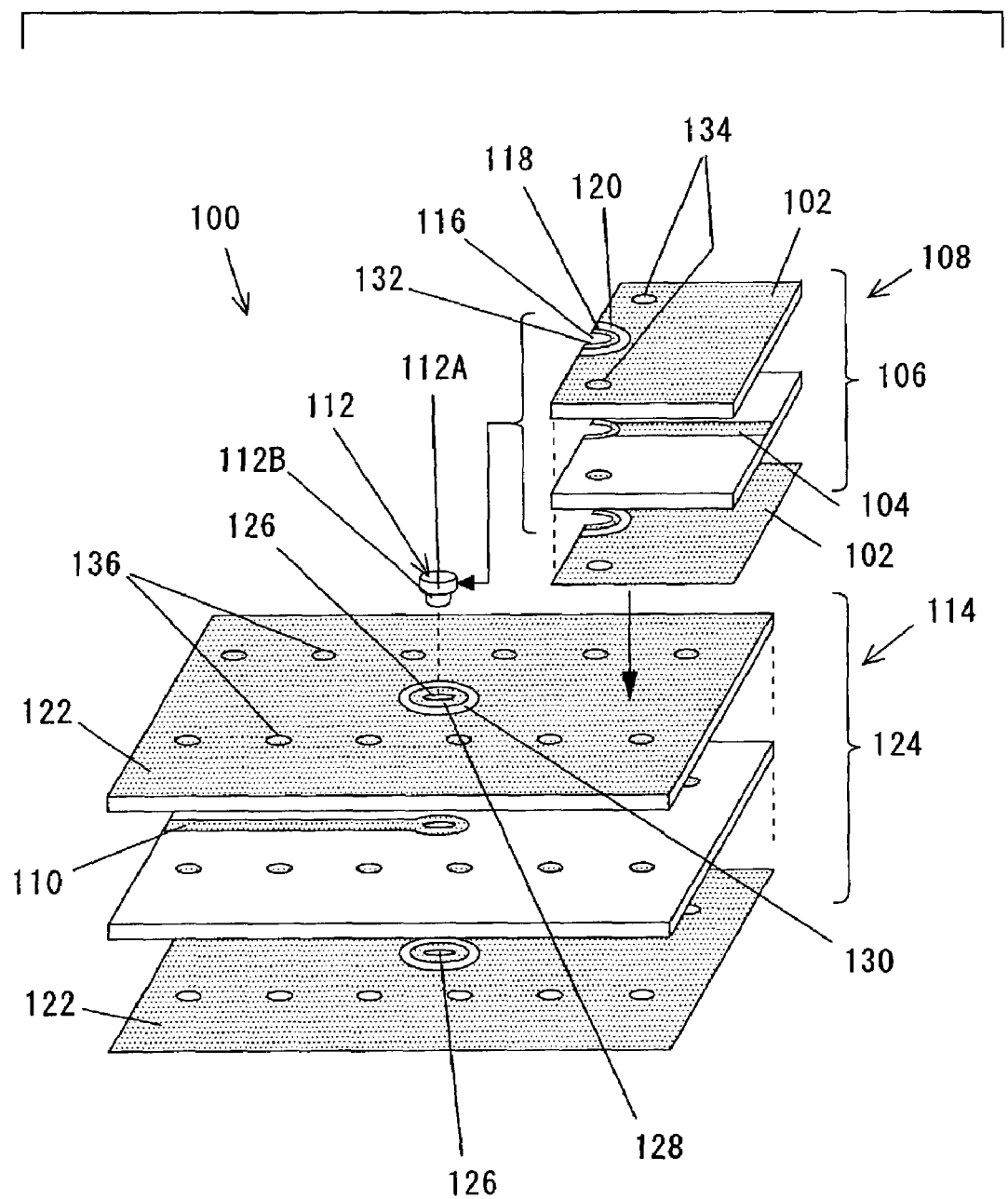
FIG. 1 is an exploded perspective view of a system for interconnecting high-frequency transmission lines according to an embodiment of the present invention.

Preferred embodiments of the present invention will be described below with reference to the drawings. Those parts of the embodiments shown in FIGS. 1 through 22 which are identical to those shown in FIGS. 23 through 26 are denoted by identical reference characters, and will not be described in detail below.

Figure 2:
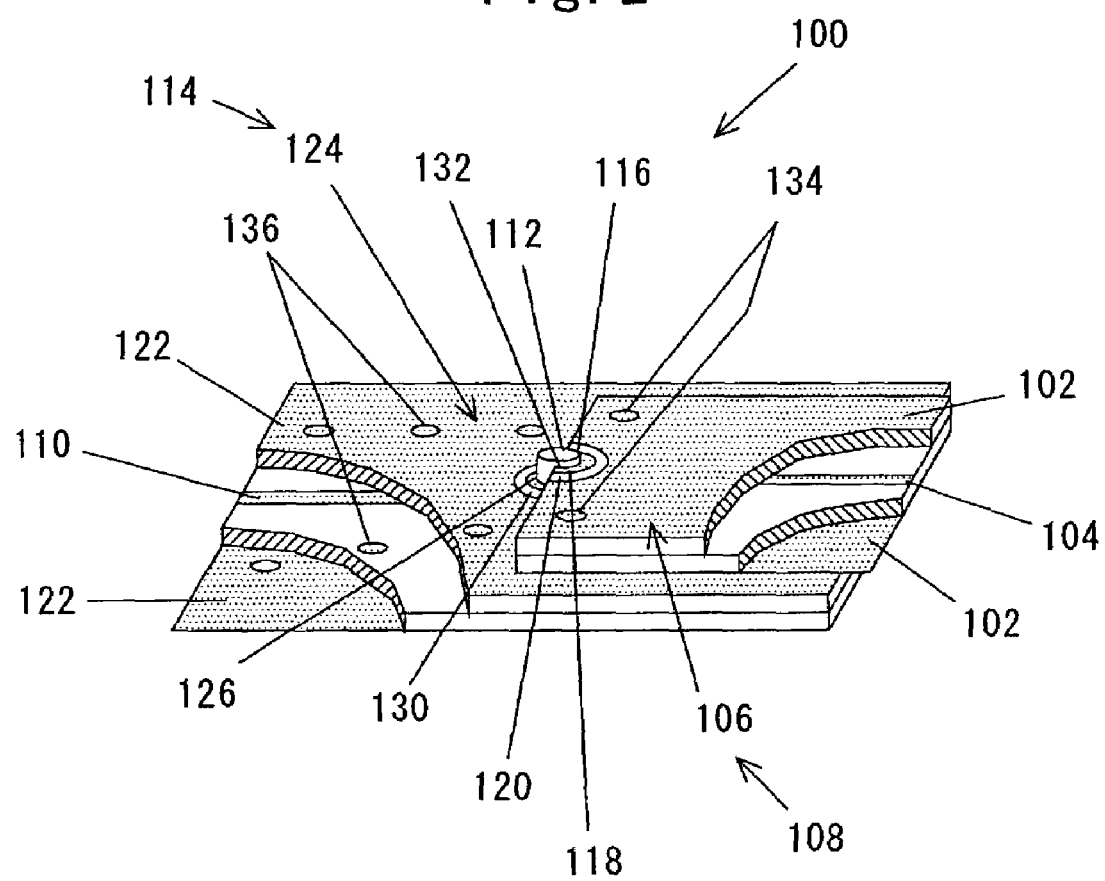
FIG. 2 is a perspective view, partly broken away, of a portion of the system for interconnecting high-frequency transmission lines shown in FIG. 1.

FIG. 1 shows in exploded perspective, a system 100 for interconnecting high-frequency transmission lines according to an embodiment of the present invention, and FIG. 2 shows in perspective, partly broken away, a portion of the system for interconnecting high-frequency transmission lines shown in FIG. 1.

As shown in FIGS. 1 and 2, the system 100 for interconnecting high-frequency transmission lines includes a first transmission line 108 and a second transmission line 114 which is electrically connected to the first transmission line 108.

The first transmission line 108 comprises a multilayer circuit board 106 of sandwiched structure having three conductive layers and two dielectric layers which jointly make up a stripline including ground patterns 102 and a first signal line 104 which comprises a signal conductor.

The second transmission line 114 comprises a multilayer circuit board 124 of sandwiched structure having three conductive layers and two dielectric layers which jointly make up a stripline including ground patterns 122 and a second signal line 110 which comprises a signal conductor. The second transmission line 114 has an electrode 112 comprising a metal terminal post mounted in a via hole 126 which is defined in an end of the second signal line 110.

The multilayer circuit board 106 has a cut via 116 defined in an end thereof which serves as an electrode connected to the first signal line 104, the cut via 116 being shaped as a semi-cylindrical form capped by top and bottom semicircular lands by cutting partially a via hole.

A clearance 120 serving as a gap for providing a matching at a junction end between the characteristic impedances of the first and second transmission lines 108, 114 is provided between a semicircular land 118 of the cut via 116 and the ground patterns 102.

The cut via 116 of the first transmission line 108 and the electrode 112 of the second transmission line 114 are electrically connected to each other, and confronting surfaces of the ground patterns 102, 122 of the first and second transmission lines 108, 114 are electrically connected to each other, thus electrically interconnecting the first and second transmission lines 108, 114.

In the embodiment shown in FIGS. 1 and 2, as described above, the second transmission line 114 comprises the multilayer circuit board 124 with the ground patterns 122 on its both surfaces and the intermediate second signal line 110 jointly making up the stripline, the second signal line 110 having the via hole 126 at its end. A clearance 130 for providing a matching at a junction end between the characteristic impedances of the first and second transmission lines 108, 114 is formed between a land 128 of the via hole 126 and the ground patterns 122. The metal terminal post is inserted in the via hole 126, making up the electrode 112.

The multilayer circuit board 106 (the first transmission line 108) is positioned on the multilayer circuit board 124 (the second transmission line 114) such that the inner semi-cylindrical wall 132 of the cut via 116 of the multilayer circuit board 106 is facing an outer surface of the metal terminal post of the electrode 112, and then the metal terminal post of the electrode 112 is connected to the inner wall 132 of the cut via 116.

The multilayer circuit board 106 and the multilayer circuit board 124 have ground via holes 134, 136 which interconnect ground patterns thereof.

In the system 100 for interconnecting high-frequency transmission lines, the electrode 112 and the via hole 126 may be connected to each other by soldering, conductive adhesive gluing, press-inserting, or any other connection techniques insofar as they can electrically connect the electrode 112 and the via hole 126 stably to each other.

If the electrode 112 and the via hole 126 are connected to each other by soldering or conductive adhesive gluing on the multilayer circuit board 124, then they are connected to each other from the reverse side of the via hole 126 opposite to the face side thereof where the electrode 112 is inserted, so that no solder or conductive adhesive will be raised on the upper surface of multilayer circuit board 124.

In FIG. 1, a top view of the cut via 116 in the first transmission line 108 is of a semicircular shape. However, the cut via 116 may be of a partial oblong shape, an arcuate shape, or any other shapes insofar as they allow the cut via 116 to be stably connected to the electrode 112 with small resistance.

The electrode 112 is in the shape of a rivet having a cylindrical head 112A and a shank 112B extending downwardly from and smaller in diameter than the head 112A. The head 112A has a diameter slightly smaller than the diameter of the cut via 116, so that the head 112A can reliably be held in contact with the cut via 116. More preferably, the diameter of the head 112A and the diameter of the cut via 116 should be substantially the same as each other to keep the entire inner wall 132 of the cut via 116 in contact with the outer circumferential surface of the head 112A of the electrode 112.

The head 112A of the electrode 112 has an axial length greater than the thickness of the multilayer circuit board 106. However, the length of the portion of the head 112A which projects from the surface of the multilayer circuit board 106 should preferably be equal to or less than $1/10$ of the wavelength of a highest-frequency signal that is to be transmitted through the first and second transmission lines 108, 114.

The cut via 116 of the first transmission line 108 and the electrode 112 of the second transmission line 114, i.e., the signal lines, and the ground patterns 102 and the ground patterns 122, i.e., the ground patterns, may be connected to each other by soldering, conductive adhesive gluing, mechanical contact, or any other connection techniques insofar as they can electrically connect the signal lines and the ground patterns stably.

The ground via holes 134 of the multilayer circuit board 106 are positioned closely to the cut via 116 for a better impedance matching.

In the system 100 for interconnecting high-frequency transmission lines shown in FIGS. 1 and 2, the electrode 116 with the convex configuration and smaller diameter fits into the cut via 116 with the concave configuration and slightly larger diameter. Therefore, the cut via 116 and the electrode 112 can be connected without any difficulty due to the shape and dimension of the cut via 116 and electrode 112.

The first transmission line 108 and the second transmission line 114 may be used in a device measuring application. For example, a signal generator is connected to the second transmission line 114 and a test device, such as a light-emitting diode or an integrated circuit, is mounted on the first transmission line 108, which is used as a subcarrier. The cut via 116 is held in contact with the electrode 112 and the ground patterns are also held in contact with each other for measuring the test device. The test device can be measured in a reduced period of time in replacement, and the first transmission line 108 constructed as a small multilayer circuit board can reduce cost.

With the system 100 for interconnecting high-frequency transmission lines shown in FIGS. 1 and 2, as described above, the cut via 116 is defined in the end of the multilayer circuit board 106, the top view of the cut via 116 being shaped as a semicircular portion of a via hole. The clearance 120 serving as a gap for providing a matching between the characteristic impedances of the first and second transmission lines 108, 114 is provided between the semicircular land 118 of the cut via 116 and the ground patterns 102. The cut via 116 of the first transmission line 108 and the electrode 112 of the second transmission line 114 are connected to each other, and the ground patterns 102, 122 of the first and second transmission lines 108, 114 are connected to each other.

The above arrangement is effective in providing a good impedance matching for a wide frequency range in excess of 10 GHz at the connection between the first and second transmission lines 108, 114.

The system 100 shown in FIGS. 1 and 2 is used to connect striplines to each other. However, the system 100 may be used to connect microstrip lines to each other or to connect a stripline and a microstrip line to each other. A system for interconnecting a stripline or a microstrip line and a coaxial cable will be described later on.

The reasons for providing the clearance 120 between the semicircular land 118 of the cut via 116 and the ground patterns 102 of the first transmission line 108 and the clearance 130 between the land 128 of the via hole 126 and the ground patterns 122 of the second transmission line 114 and how the dimensions of the clearances 120, 130 are determined will be described below with respect to the multilayer circuit board 124, for example.

Figure 3:
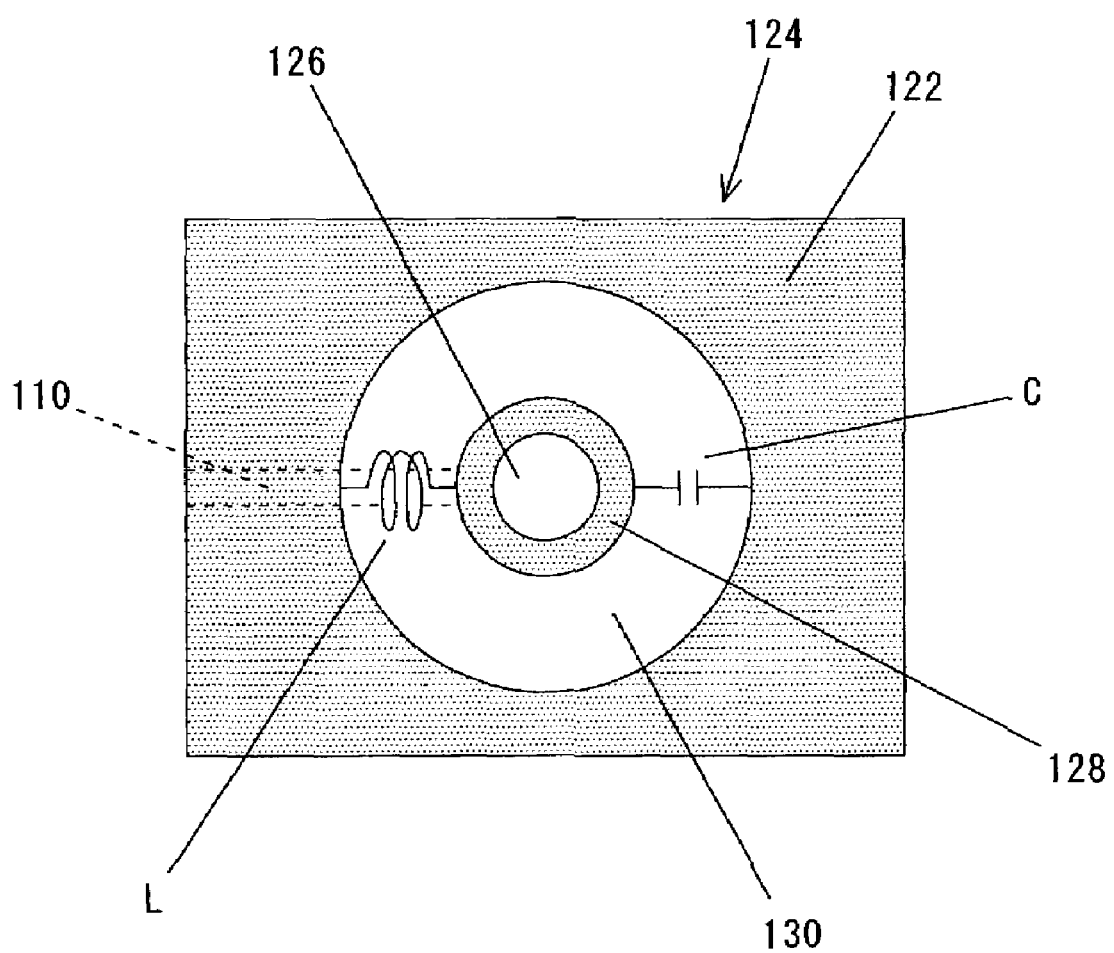
FIG. 3 is a front elevational view of a portion of a multilayer circuit board near a via hole, the view also showing a stray device model associated with the via hole.

FIG. 3 shows in front elevation a portion of the multilayer circuit board 124 near the via hole 126.

A stray capacitance C (capacitance value is also represented by C) illustrated as a schematic representation of a bulk constant occurs between the via hole 126 and the ground pattern 122. The stray capacitance C varies depending on the gap between the outer circumferential edge of the land 128 and the inner circumferential edge of the ground pattern 122, i.e., the width of the clearance 130.

If the diameter of the clearance 130 is increased, then a region of the second signal line 110 which does not vertically confront the upper and lower ground patterns 122 increases, so that the distributed capacitance of the triplate structure is reduced. At the same time, since a distance increase between electrodes of the via hole 126 and the ground pattern 122 contributes to decrease of a stray capacitor between the electrodes, the total stray capacitance C is reduced. On the other hand, a stray inductance L (inductance value is also represented by L) illustrated as a schematic representation of a concentrated constant increases.

The characteristic impedance near the via hole 126 can be determined as $(L/C)^{1/2}$. Therefore, a characteristic impedance matching can be achieved by adjusting the diameter of the clearance 130.

Figure 4:
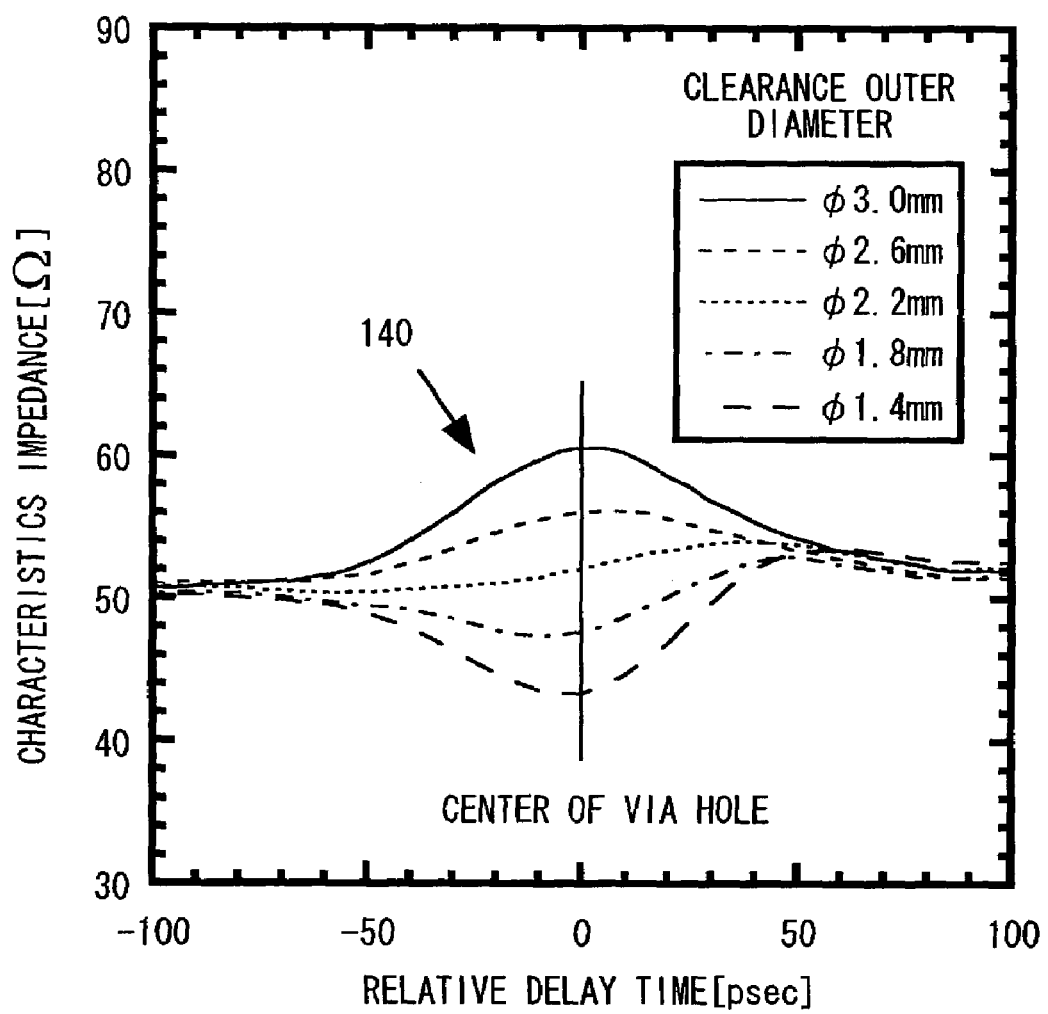
FIG. 4 is a diagram showing measured changes in a characteristic impedance at different clearance diameters.

FIG. 4 shows measured changes 140 in a characteristic impedance at different clearance diameters. Specifically, the illustrated data represent reflection characteristics of a transmission system measured by a time domain reflection amplitude based on TDR (Time Domain Reflectometry). In FIG. 4, the horizontal axis represents a relative delay time [psec] with the central position of the via hole 126, being normalized at 0, and the vertical axis represents a characteristic impedance [Ω].

The rise time of a measurement pulse of TDR was set to 30 [psec]. The rise time corresponds to the cutoff frequency of about 12 GHz, and the illustrated data represent frequency characteristics of the impedance in a frequency range up to 10 GHz.

The data shown in FIG. 4 were obtained when an inner diameter of the via hole 126 was 0.6 [mm], an outer diameter of the land 128 was 1.0 [mm], and the outer diameter of the clearance 130 was changed in the range from 1.4 to 3.0 [mm].

Since the stray inductance L and the stray capacitance C change as the outer diameter of the clearance 130 changes, an optimum dimension of the clearance 130 for 50[Ω] can be determined from the measured changes 140. In the example shown in FIG. 4, the optimum outer diameter of the clearance 130 is 2.2 [mm]. Thus, there can be provided a connection between the first transmission line 108 and the second transmission line 114 while achieving a characteristic impedance matching therebetween.

Figure 5:
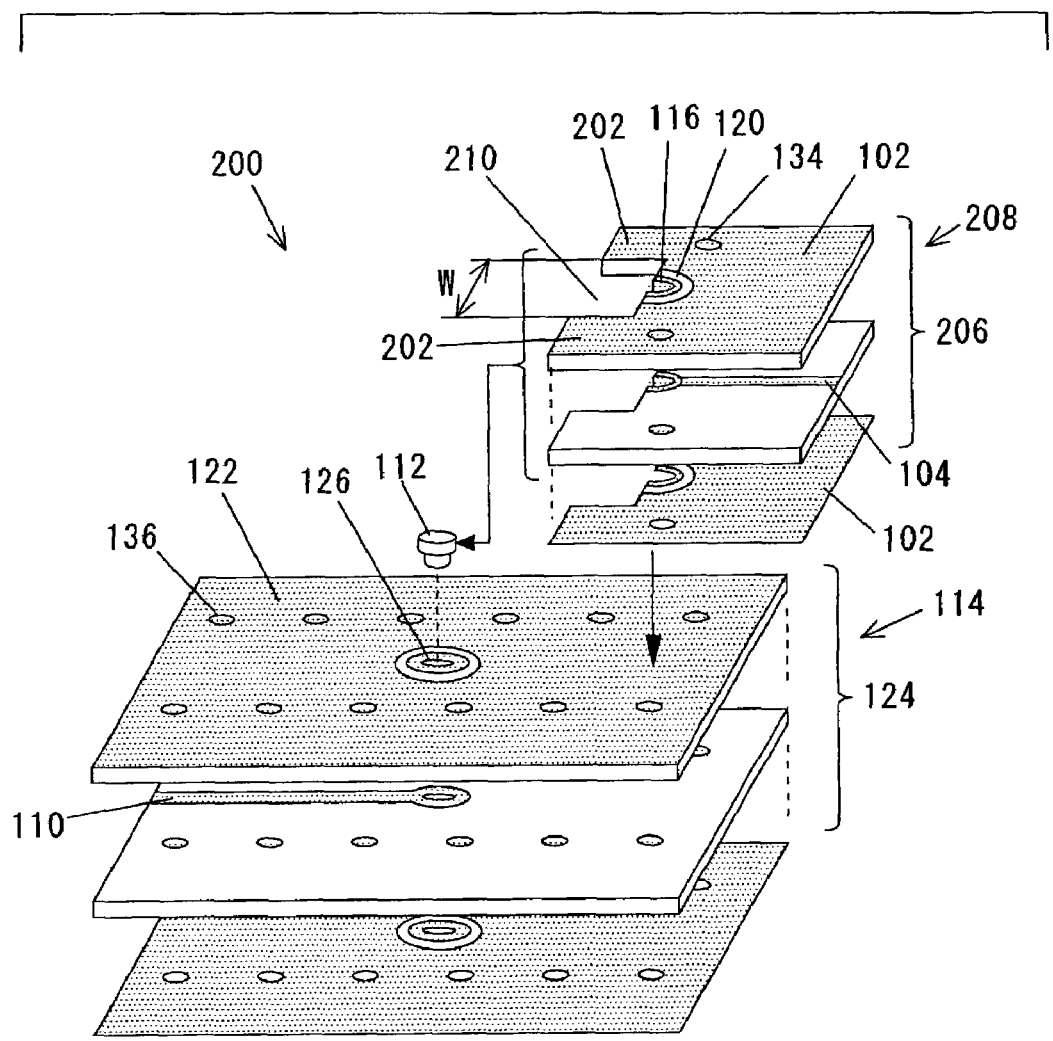
FIG. 5 is an exploded perspective view of a system for interconnecting high-frequency transmission lines according to another embodiment of the present invention.
Figure 6:
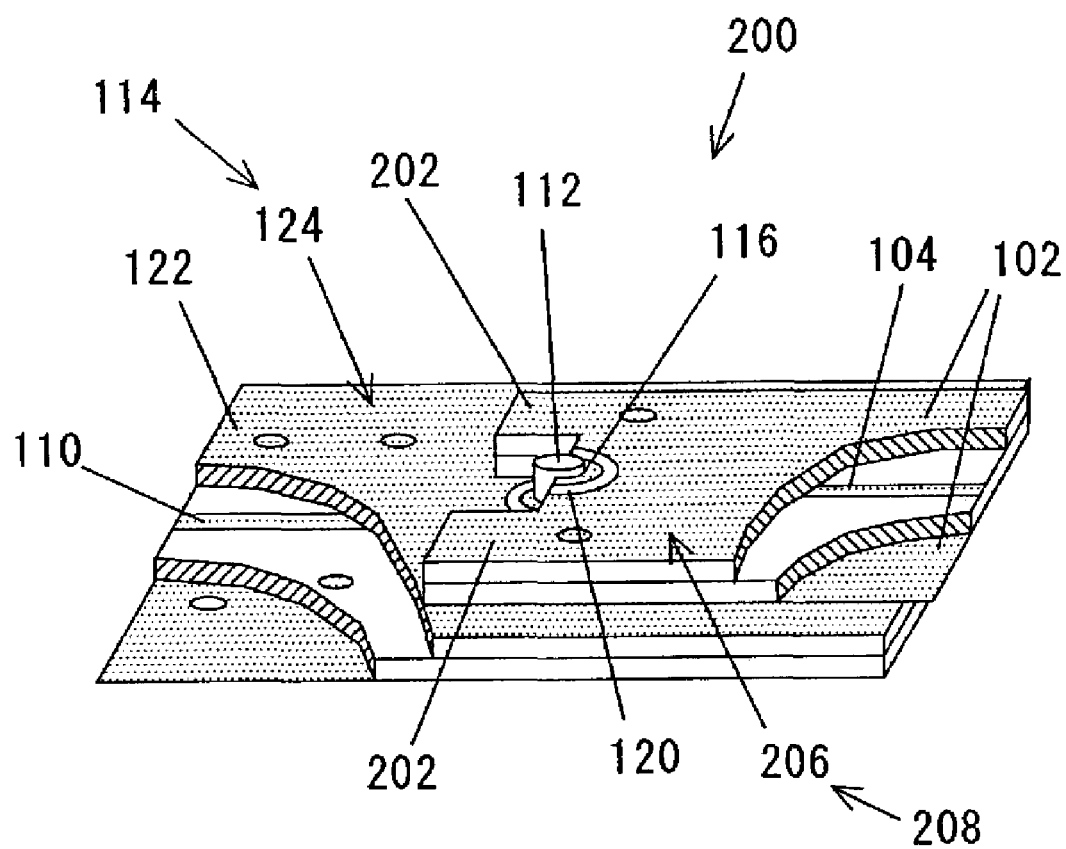
FIG. 6 is a perspective view, partly broken away, of a portion of the system for interconnecting high-frequency transmission lines shown in FIG. 5.

FIG. 5 shows in exploded perspective, a system 200 for interconnecting high-frequency transmission lines according to another embodiment of the present invention, and FIG. 6 shows in perspective, partly broken away, a portion of the system 200 for interconnecting high-frequency transmission lines shown in FIG. 5.

Those parts of the embodiment shown in FIGS. 5, 6 which are identical to those shown in FIGS. 23 through 26, 1 through 4 are denoted by identical reference characters, and will not be described in detail below. Similarly, those parts of the other embodiments which are identical to those described in previous embodiments are denoted by identical reference characters, and will not be described in detail below.

The system 200 shown in FIGS. 5 and 6 has a first transmission line 208 comprising a multilayer circuit board 206 which includes a pair of sleeves (also referred to as ground sleeves) 202 spaced a distance W laterally from each other and extending outwardly from an end of the ground pattern 102 on both sides of the end (left end in FIG. 5) of the cut via 116, one on each side of the clearance 120 that positioned outside of the cut via 116 in the end of the multilayer circuit board 206 of the first transmission line 208.

The second transmission line 114 shown in FIGS. 5 and 6 is identical to the second transmission line 114 according to the embodiment shown in FIGS. 1 through 4.

The multilayer circuit board 206 and the multilayer circuit board 124 have ground via holes 134, 136 which interconnect ground layers or patterns thereof.

With the above system 200 for interconnecting high-frequency transmission lines, the ground sleeves 202 which are spaced by a gap 210 from each other have surfaces confronting the multilayer circuit board 124, i.e., lower ground conductor surfaces of the multilayer circuit board 206, and these surfaces are connected to the ground patterns 122 of the multilayer circuit board 124. Therefore, the ground patterns are prevented from being short-circuited to the electrode 112 that is connected to the signal lines 104, 110.

A connecting means such as a solder body may be applied to the ground sleeves 202 on the lower surface of the multilayer circuit board 206 to reliably interconnect the ground patterns of the first and second transmission lines 208, 114 in the vicinity of the electrode 112.

As described later only, the ground sleeves 202 may be pressed downwardly by pressing members such as springs or the like to reliably interconnect the ground patterns of the first and second transmission lines 208, 114 in the vicinity of the electrode 112.

The gap width W between the ground sleeves 202 is wider than the outer diameter of the clearance 120. Therefore, the ground sleeves 202 provided on the first transmission line 208 do not affect the characteristic impedance thereof.

In the embodiment shown in FIGS. 5 and 6, the ground sleeves 202 and the cut via 116 are formed at the same time when the area of the multilayer circuit board 206 which corresponds to the gap 210 is cut off.

Figure 7:
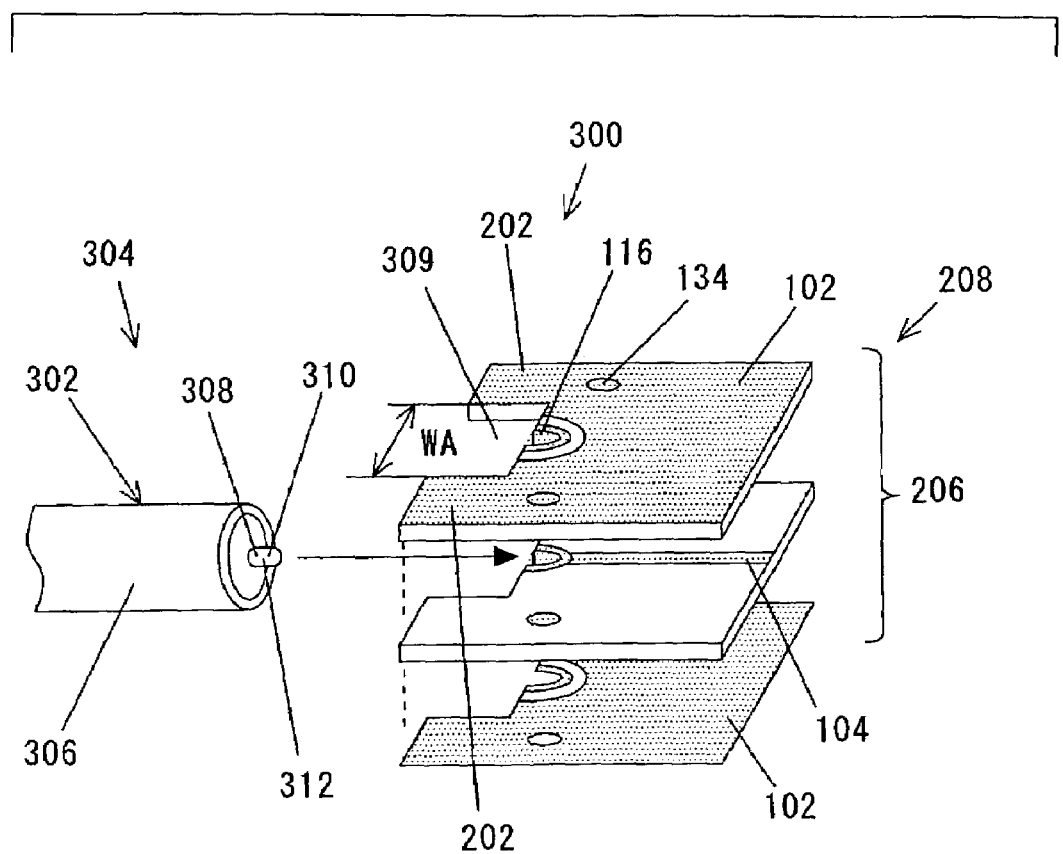
FIG. 7 is an exploded perspective view of a system for interconnecting high-frequency transmission lines according to still another embodiment of the present invention.
Figure 8:
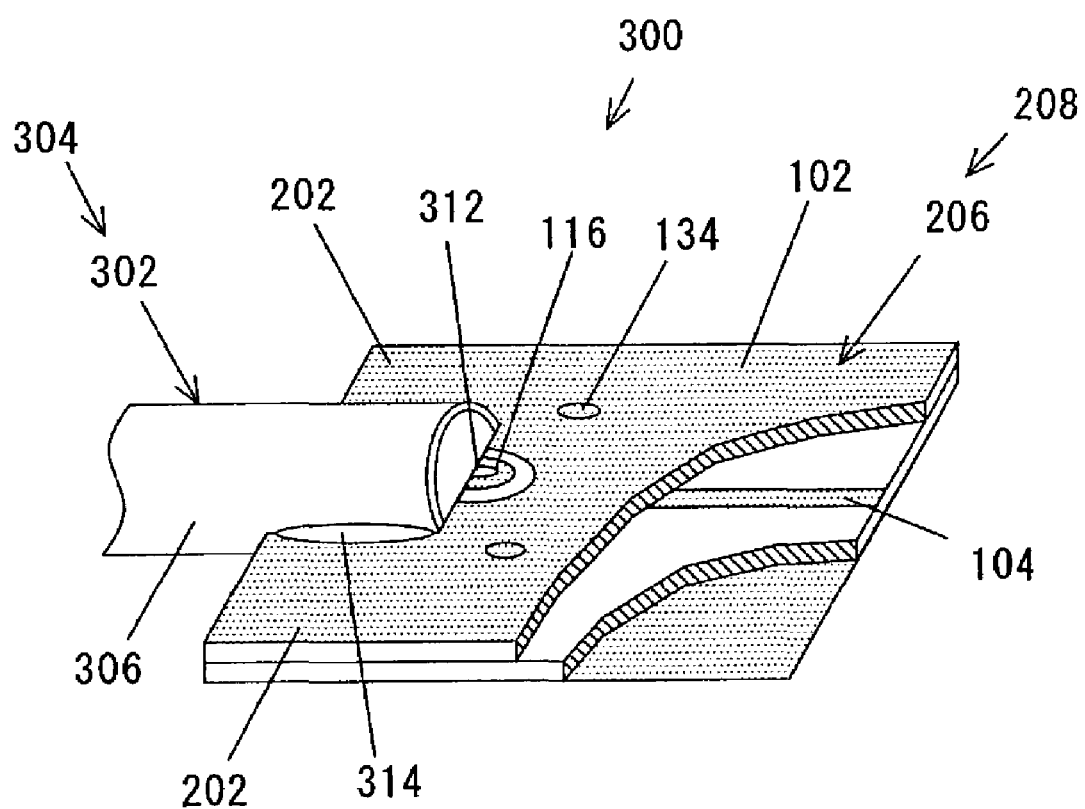
FIG. 8 is a perspective view, partly broken away, of a portion of the system for interconnecting high-frequency transmission lines shown in FIG. 7.

FIG. 7 shows in exploded perspective, a system 300 for interconnecting high-frequency transmission lines according to still another embodiment of the present invention, and FIG. 8 shows in perspective, partly broken away, a portion of the system 300 for interconnecting high-frequency transmission lines shown in FIG. 7.

The system 300 shown in FIGS. 7 and 8 includes a coaxial cable 302 as a second transmission line 304 which is connected to the first transmission line 208 which comprises the multilayer circuit board 206 having the ground sleeves 202 on both sides of the cut via 116 as shown in FIGS. 5 and 6.

The coaxial cable 302 comprises a so-called semirigid cable having an outer conductor 306 in the form of a pipe of copper, a dielectric layer of polytetrafluoroethylene disposed in the outer conductor 306, and a central conductor 310 comprising a rigid wire or twisted wires of copper disposed in the dielectric layer. The characteristic impedance of the coaxial cable is 50[Ω].

The ground sleeves 202 are laterally spaced from each other by a distance WA which is provided by a gap 309 that is slightly wider than the ouger diameter of the outer conductor 306 of the coaxial cable 302, so that the outer conductor 306 can be sandwiched between the ground sleeves 202.

As shown in FIG. 7, the central conductor 310 of the coaxial cable 302 which serves as a second signal line 308 of the second transmission line 304 has a bare wire strip exposed as an electrode 312. As shown in FIG. 8, the outer conductor 306 of the coaxial cable 302 is inserted into the gap 309 between the ground sleeves 202. The outer conductor 306 and the ground patterns 102 of the ground sleeves 202 are connected to each other by solder bodies 314 preferably at four locations, i.e., upper and lower spots on both sides of the outer conductor 306, and the electrode 312 as the bare wire strip of the central conductor 310 is also connected to the cut via 116 of the first transmission line 208 by soldering or the like.

The multilayer circuit board 206 has ground via holes 134 which interconnect the upper and lower ground patterns thereof.

With the above system 300 for interconnecting high-frequency transmission lines, the first signal line 104 of the signal conductor and the central conductor 310 of the coaxial cable 302 should preferably be connected co-lineally each other. However, no problem will arise if the coaxial cable 302 is vertically displaced within the length of the cut via 116 and connected to the first signal line 104 insofar as desired transmission characteristics are maintained.

Figure 9:
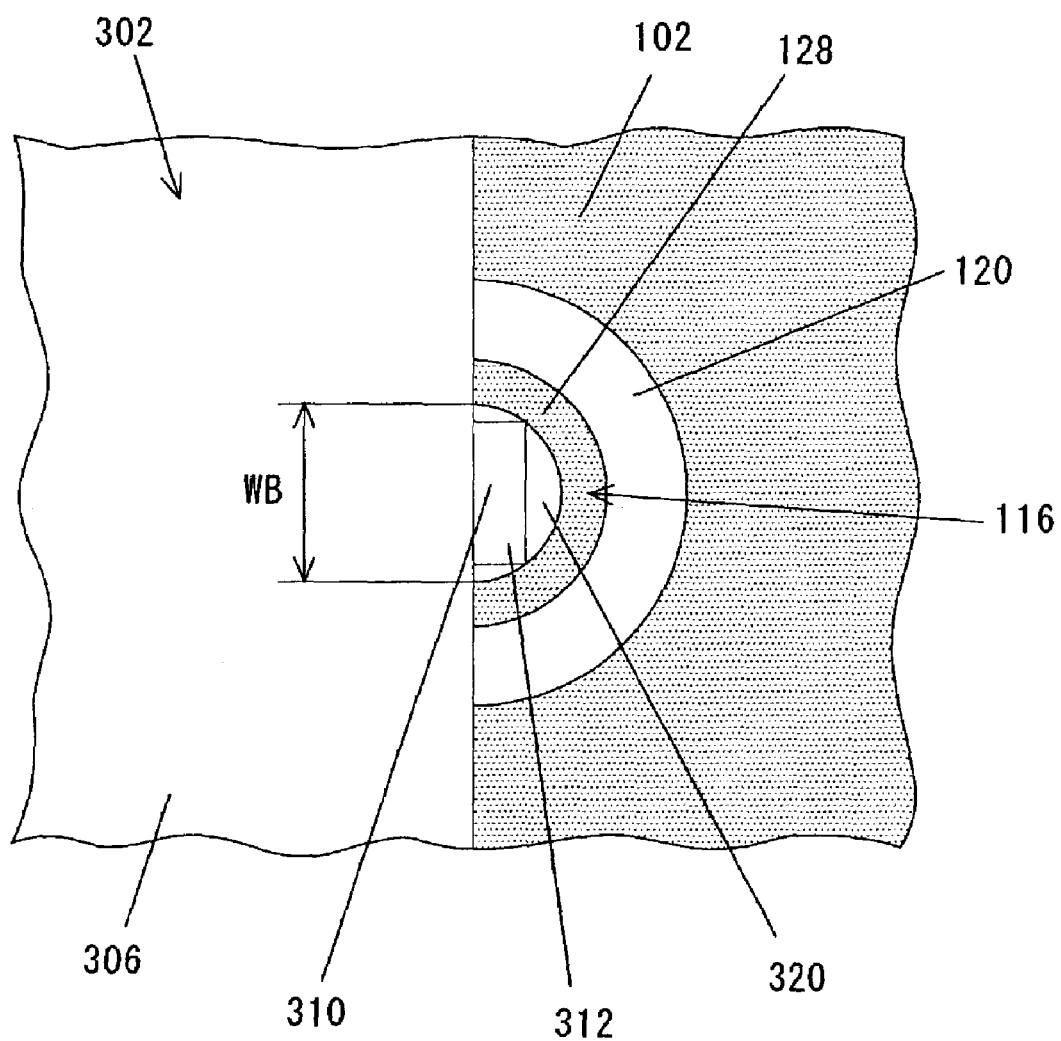
FIG. 9 is an enlarged fragmentary view showing a junction between a coaxial cable and a cut via.

FIG. 9 shows fragmentarily at an enlarged scale the junction between the coaxial cable 302 and the cut via 116. As shown in FIG. 9, the cut via 116 has a recess (hole) 320 having a diameter WB which is sized to be able to accommodate the central conductor 310 of the coaxial cable 302 inserted in the recess 320. The central conductor 310 of the coaxial cable 302 is thus snugly placed in the recess 320. With the very short central conductor 310 snugly placed in the recess 320, no extra stray inductance and stray capacitance occur on the central conductor 310 of the second signal line, allowing a characteristic impedance matching to be achieved easily between the first and second transmission lines 208, 304.

The cut via 116 and the central conductor 310 may be connected to each other by soldering or conductive adhesive gluing.

As shown in FIG. 8, the ground sleeves 202 and the outer conductor 306 may be connected to each other by a conductive adhesive rather than the solder bodies 314 to avoid thermal deformation of the second transmission line 304 by high temperature.

Since the ground sleeves 202 and the outer conductor 306 are connected to each other at four locations, i.e., upper and lower spots on both sides of the outer conductor 306, the connection between the ground sleeves 202 and the outer conductor 306 gains a large mechanical strength.

The gap WA between the ground sleeves 202 is essentially the same as the outer diameter of the outer conductor 306 of the coaxial cable 302 to allow the coaxial cable 302 to be easily positioned with respect to the first transmission line 208 having the cut via 116, and also to allow the central conductor 310 of the coaxial cable 302 to be easily positioned with respect to the recess 320 in the cut via 116 in the first transmission line 208. Therefore, the first and second transmission lines 208, 304 can be connected with better reproducibility and highly efficiently without skill and expertise. Accordingly, the system 300 can be manufactured at a reduced cost.

Figure 24:
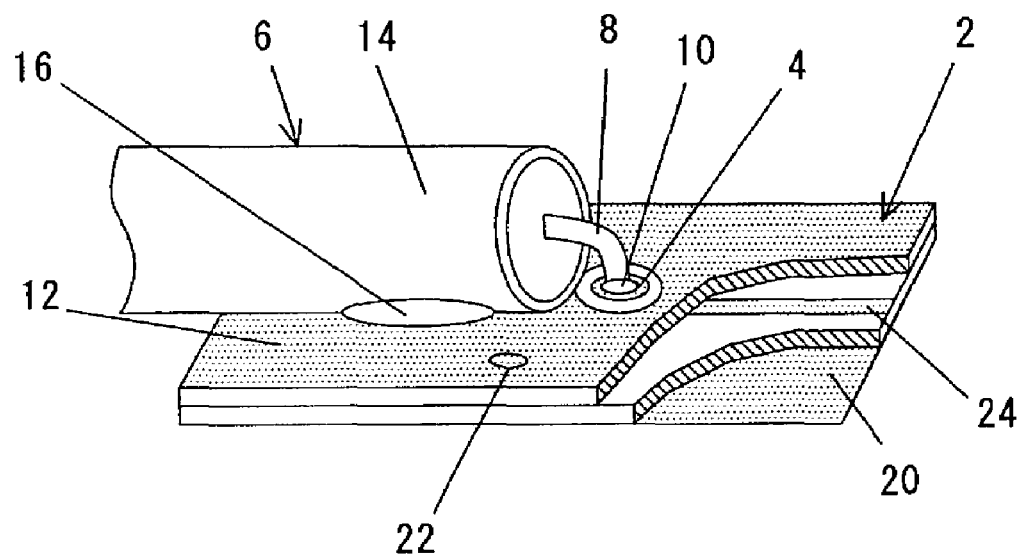
FIG. 24 is a perspective view, partly broken away, of a portion of the connection structure shown in FIG. 23.
Figure 25:
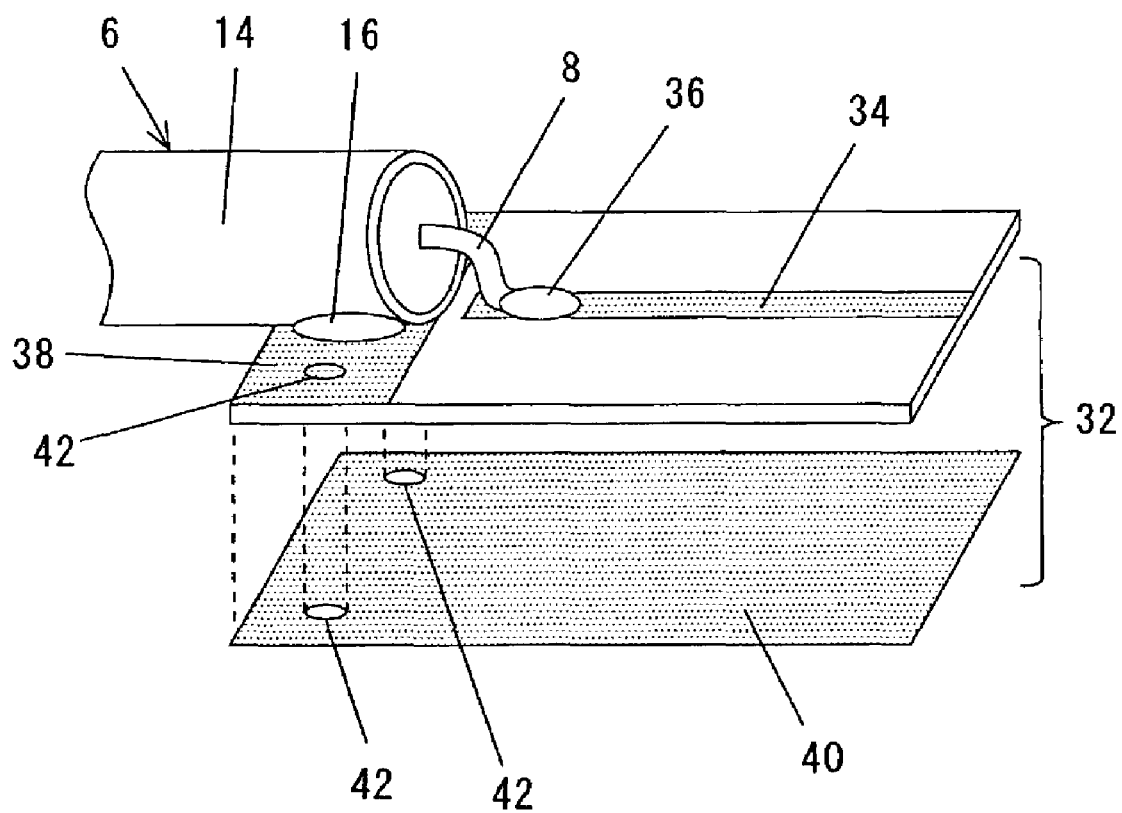
FIG. 25 is an exploded perspective view of a connection structure according to prior art 2.
Figure 26:
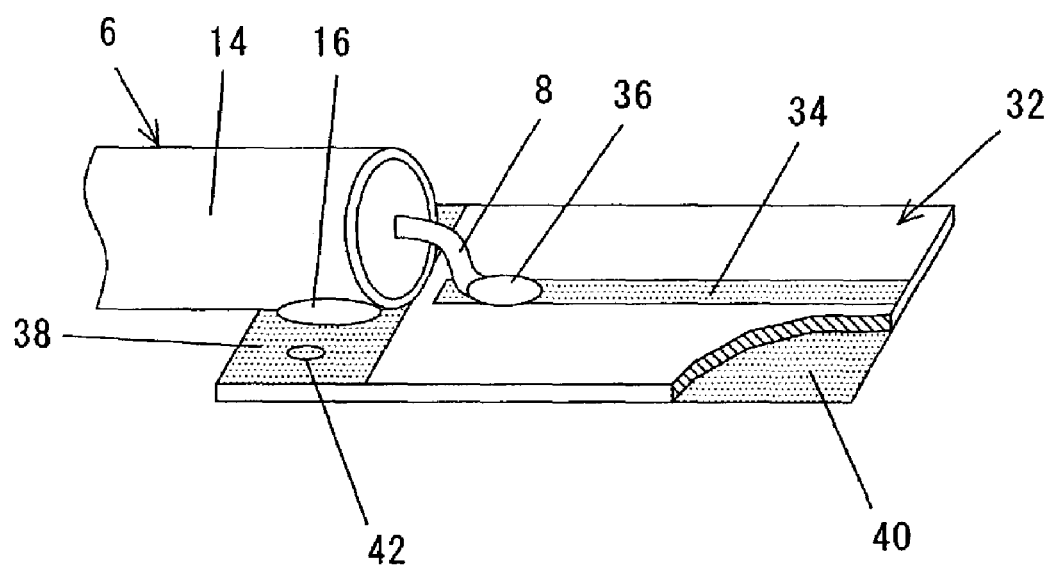
FIG. 26 is a perspective view, partly broken away, of a portion of the connection structure shown in FIG. 25.

Furthermore, the strip length of the central conductor 310 of the coaxial cable 302 is much shorter than with the conventional structures shown in FIGS. 24 and 26. Accordingly, the system 300 is substantially not susceptible to extraneous electromagnetic interferences.

Figure 10:
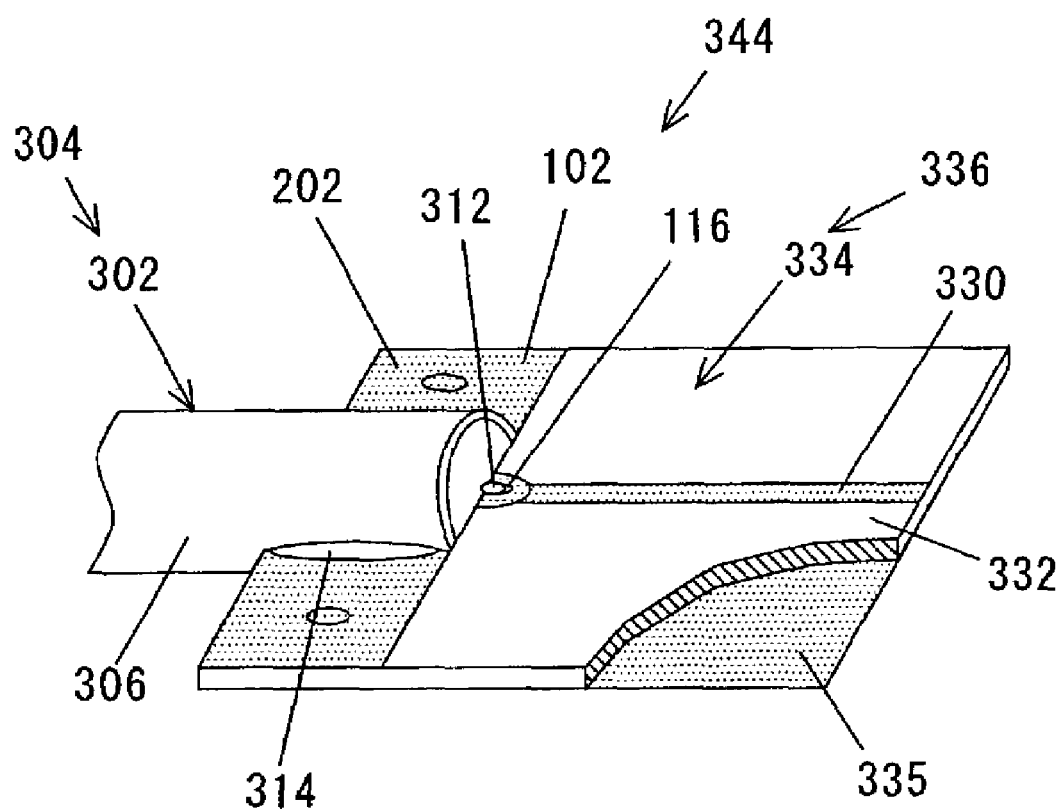
FIG. 10 is a perspective view, partly broken away, of a system for interconnecting high-frequency transmission lines which comprise a microstrip line and a coaxial cable, respectively.

FIG. 10 shows in perspective, partly broken away, a system 344 for interconnecting high-frequency transmission lines which comprise a microstrip line as a first transmission line 336 and the coaxial cable 302 as the second transmission line 304, respectively.

As shown in FIG. 10, the coaxial cable 302 as the second transmission line 304 is connected to the first transmission line 336 which comprises a multilayer circuit board 334 as a doublet microstrip line comprising a first signal line 330 as a surface conductor comprising a signal conductor, a dielectric layer 332, and a ground pattern 335 as a reverse side conductor.

Figure 11:
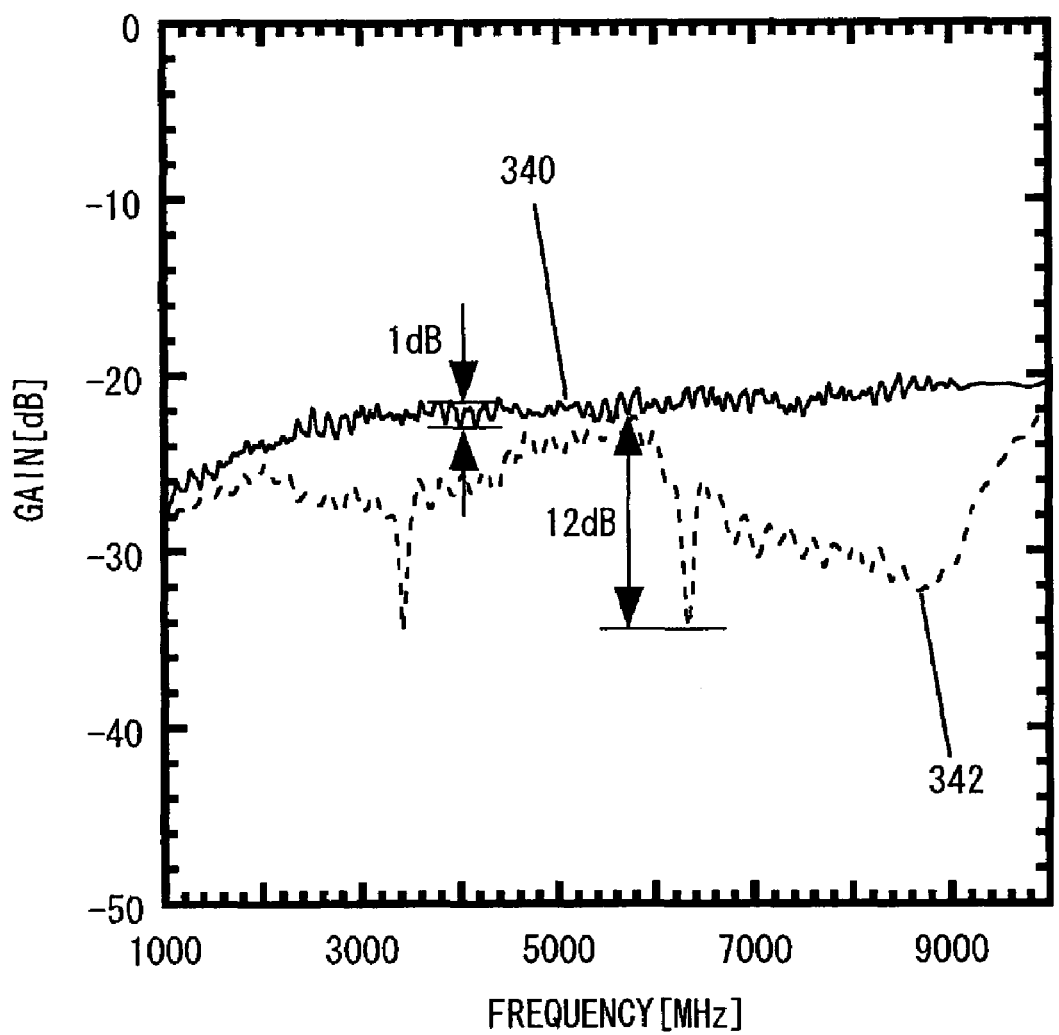
FIG. 11 is a diagram showing gains for comparison between the transmission characteristics of the system for interconnecting high-frequency transmission lines shown in FIG. 8 and the transmission characteristics of the conventional system for interconnecting high-frequency transmission lines shown in FIG. 23.
Figure 23:
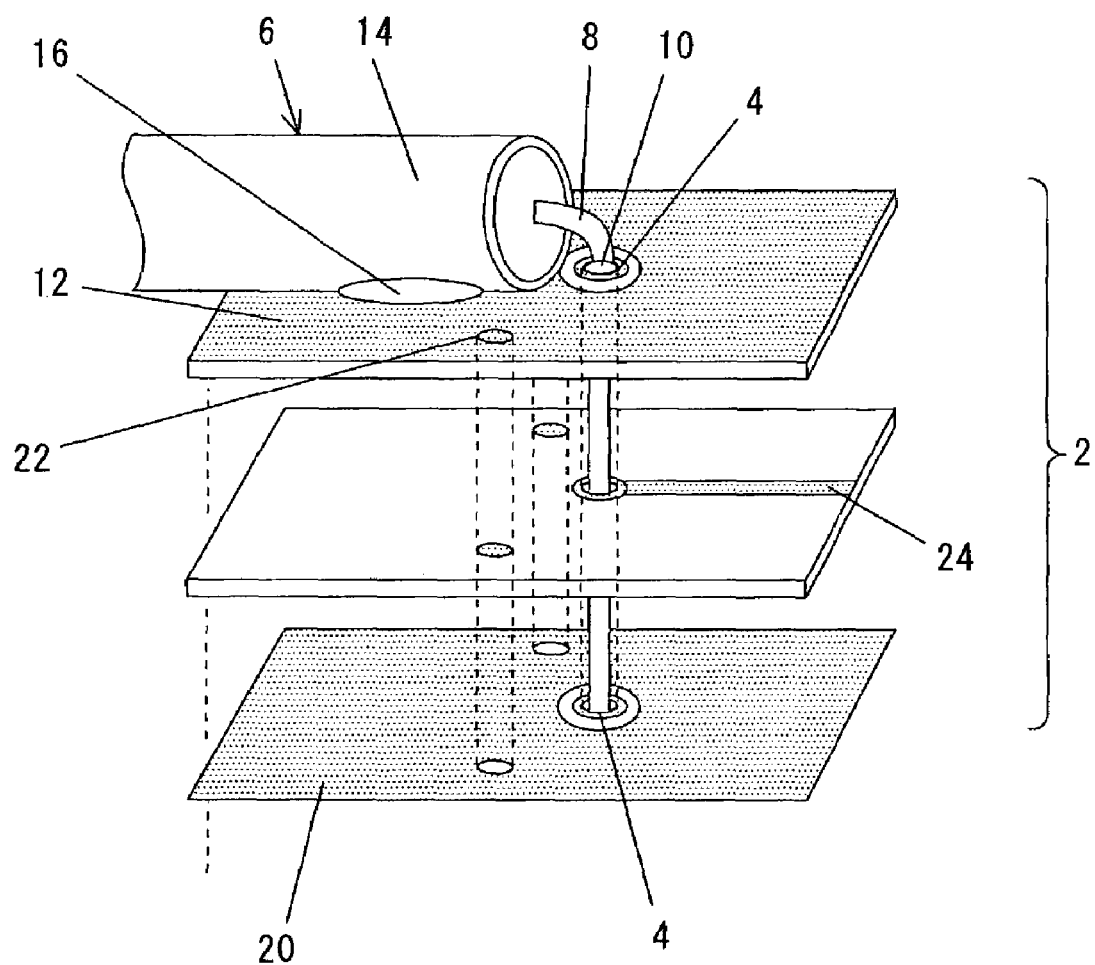
FIG. 23 is an exploded perspective view of a connection structure according to prior art 1.

FIG. 11 shows gains for comparison between the transmission characteristics 340 of the system 300 for interconnecting high-frequency transmission lines shown in FIG. 8 and the transmission characteristics 342 of the conventional system for interconnecting high-frequency transmission lines shown in FIG. 23. The transmission characteristics 340, 342 are measured by a magnetic sensor, i.e., a shielded loop coil with a connection structure formed by a printed pattern, as a test device in the form of a terminal end of a stripline that is placed in a uniform magnetic field which is generated by an open-sided TEM (Transverse ElectroMagnetic) cell. The open-sided TEM cell is driven in negligible frequency dependence by a signal outputted from a network analyzer, and the magnetic sensor supplies a signal representing a detected magnetic field as an input to the network analyzer. The ratio of the signal input (outputted from the magnetic sensor) to the signal output (inputted to the open-sided TEM cell) is measured and calculated as the transmission characteristics 340, 342 by the network analyzer.

It can be seen from the gain diagram shown in FIG. 11 that the transmission characteristics 342 of the conventional system have loss peaks of 12 [dB] at maximum near 3.4 [GHz] and 6.3 [GHz]. An analysis of gains vs. frequencies shows that the loss peaks are caused by reflections produced at the connection between the high-frequency transmission lines, indicating a poor impedance matching. It can also be seen from FIG. 11 that the transmission characteristics 340 of the system 300 contain only small gain variations of about 1 [dB] in a frequency range from 1 [GHz] to 10 [GHz], indicating considerably a better impedance matching than the transmission characteristics 342 of the conventional system.

Figure 12:
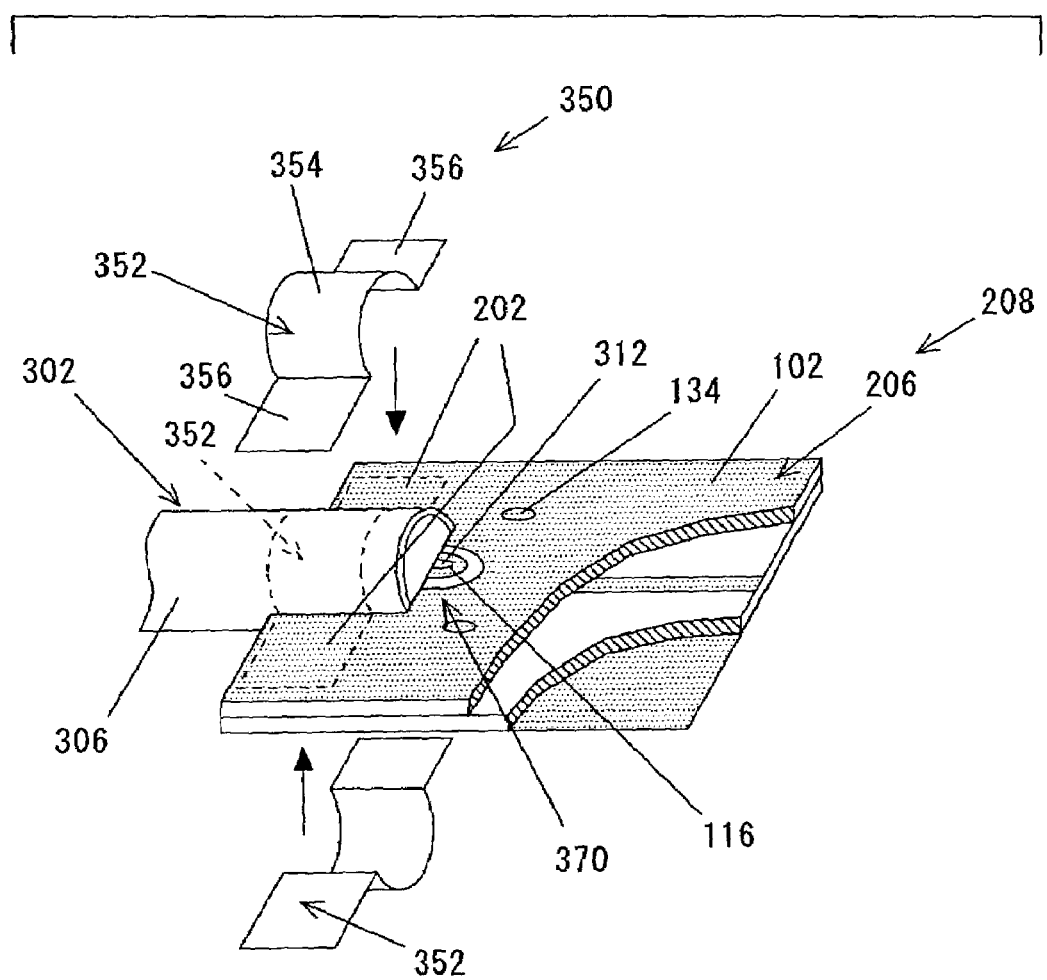
FIG. 12 is an exploded perspective view, partly broken away, of a system for interconnecting high-frequency transmission lines according to yet another embodiment of the present invention.

FIG. 12 shows in exploded perspective, partly broken away, a system 350 for interconnecting high-frequency transmission lines according to yet another embodiment of the present invention.

The system 350 has upper and lower conductive fittings 352 for connecting the ground conductor as the outer conductor 306 of the coaxial cable 302 and the ground patterns 102 of the multilayer circuit board 206 at the ground sleeves 202 of the first transmission line 208. The conductive fittings 352 are disposed respectively on the upper and lower sides of the multilayer circuit board 206 and pressed against and held in contact with respective portions of the outer conductor 306 of the coaxial cable 302, and are connected to the ground patterns 102 of the first transmission line 208.

In FIG. 12, the conductive fittings 352 are shown as being spaced from the coaxial cable 302 and the ground sleeves 202 for an easier understanding of the system 350. Each of the conductive fittings 352 comprises a semicylindrical web 354 shaped complementarily to the outer circumferential shape of the outer conductor 306 of the coaxial cable 302 and a pair of wings 356 extending from opposite ends of the semicylindrical web 354 outwardly parallel to the multilayer circuit board 206.

The conductive fittings 352 function as press fittings, and are dimensioned to tightly contact the outer conductor 306 of the coaxial cable 302 and the ground sleeves 202 of the multilayer circuit board 206.

In FIG. 12, the conductive fittings 352, the ground sleeves 202, and the outer conductor 306 are electrically connected to each other by soldering or the like along the circumferential edges of the conductive fittings 352 as indicated by the broken lines. The conductive fittings 352, the ground sleeves 202, and the outer conductor 306 are thus stably electrically connected to each other, and the junctions therebetween are of high mechanical strength.

The wings 356 of the conductive fittings 352 and the multilayer circuit board 206 may have bolt holes, and the conductive fittings 352 may be fastened together across the multilayer circuit board 206 by bolts and nuts for electrically and mechanically joining the conductive fittings 352, the ground sleeves 202, and the outer conductor 306 to each other.

Even if the gap WA (see FIG. 7) between the ground sleeves 202 is greater than the diameter of the outer conductor 306 of the coaxial cable 302, leaving gaps between the outer conductor 306 and the ground sleeves 202, the conductive fittings 352 are effective in connecting the outer conductor 306 to the multilayer circuit board 206 without disturbing the characteristic impedance of a signal connection 370 in the vicinity of the cut via 116 and the electrode 312.

By temporarily fastening the conductive fittings 352 to the multilayer circuit board 206 with bolts and nuts, the electrode 312 as the strip end of the central conductor 310 of the coaxial cable 302 can easily be positioned in the cut via 116 for better efficiency in assembling the system 350.

Figure 13:
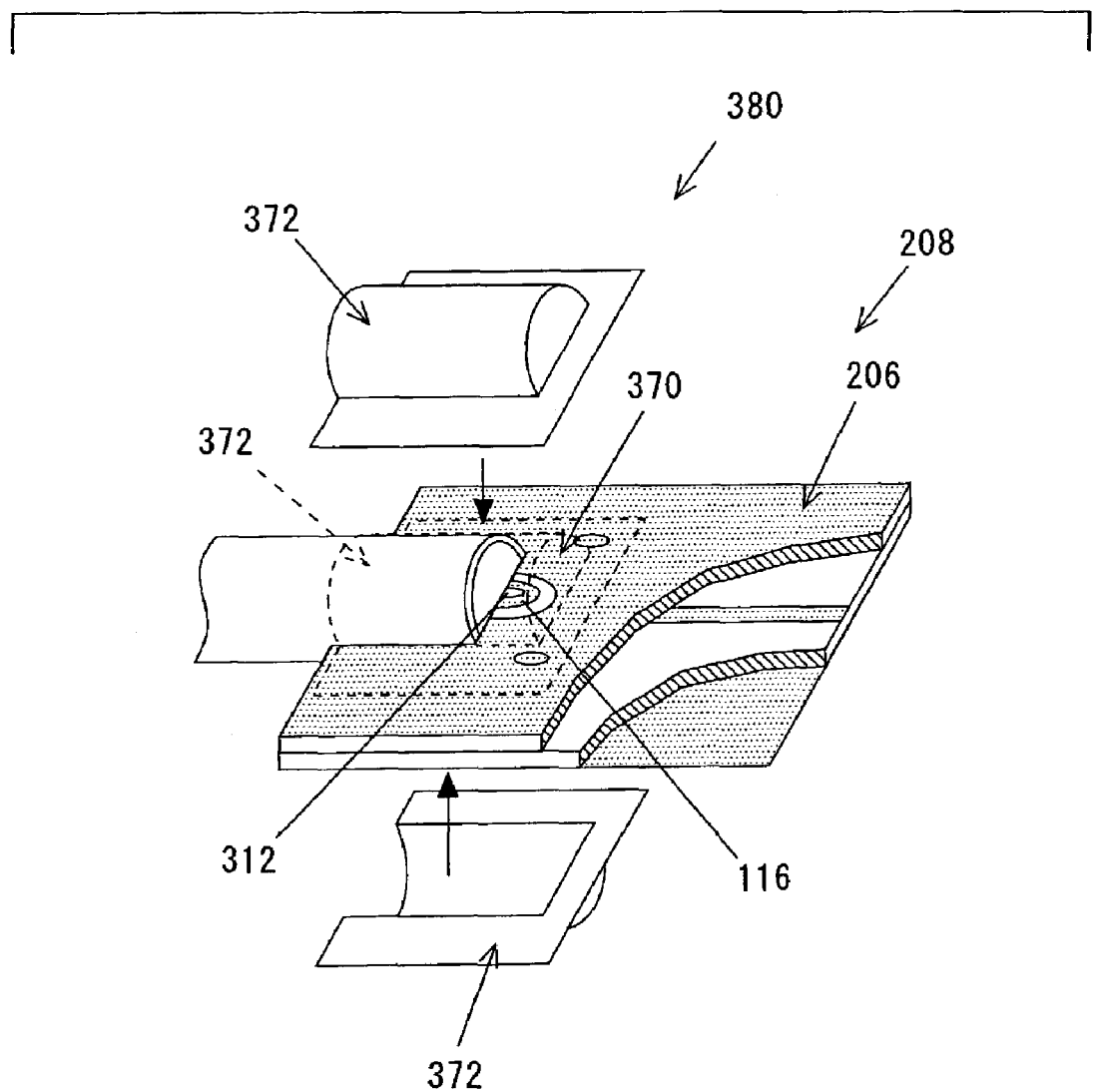
FIG. 13 is an exploded perspective view, partly broken away, of a system for interconnecting high-frequency transmission lines according to yet still another embodiment of the present invention.

FIG. 13 shows in exploded perspective, partly broken away, of a system 380 for interconnecting high-frequency transmission lines according to yet still another embodiment of the present invention. The system 380 has conductive fittings 372 capable of covering the signal connection 370.

The conductive fittings 372 are effective in fully shielding the signal connection 370 from extraneous electromagnetic waves. The area that is covered by the conductive fittings 372 should preferably be of a such size that will not disturb the characteristic impedance of the signal connection 370.

Figure 14:
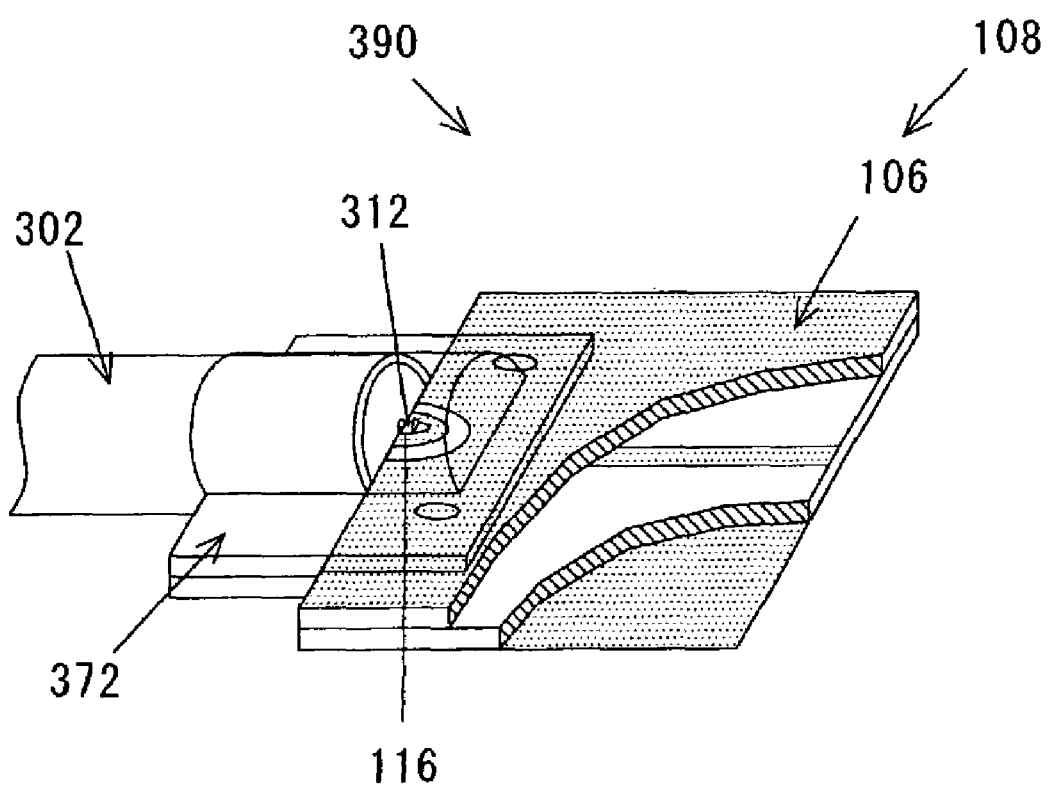
FIG. 14 is a perspective view, partly broken away and transparently, of a system for interconnecting high-frequency transmission lines according to a further embodiment of the present invention.

FIG. 14 shows in perspective, partly broken away and transparently, a system 390 for interconnecting high-frequency transmission lines according to a further embodiment of the present invention. The system 390 has a conductive fitting 372 which is of a shape suitable to connect the coaxial cable 302 to the multilayer circuit board 106 shown in FIG. 2 which is free of the ground sleeves 202. The conductive fitting 372 is shown as being transparent with only its contour being illustrated for an easier understanding of the system 390.

Figure 15:
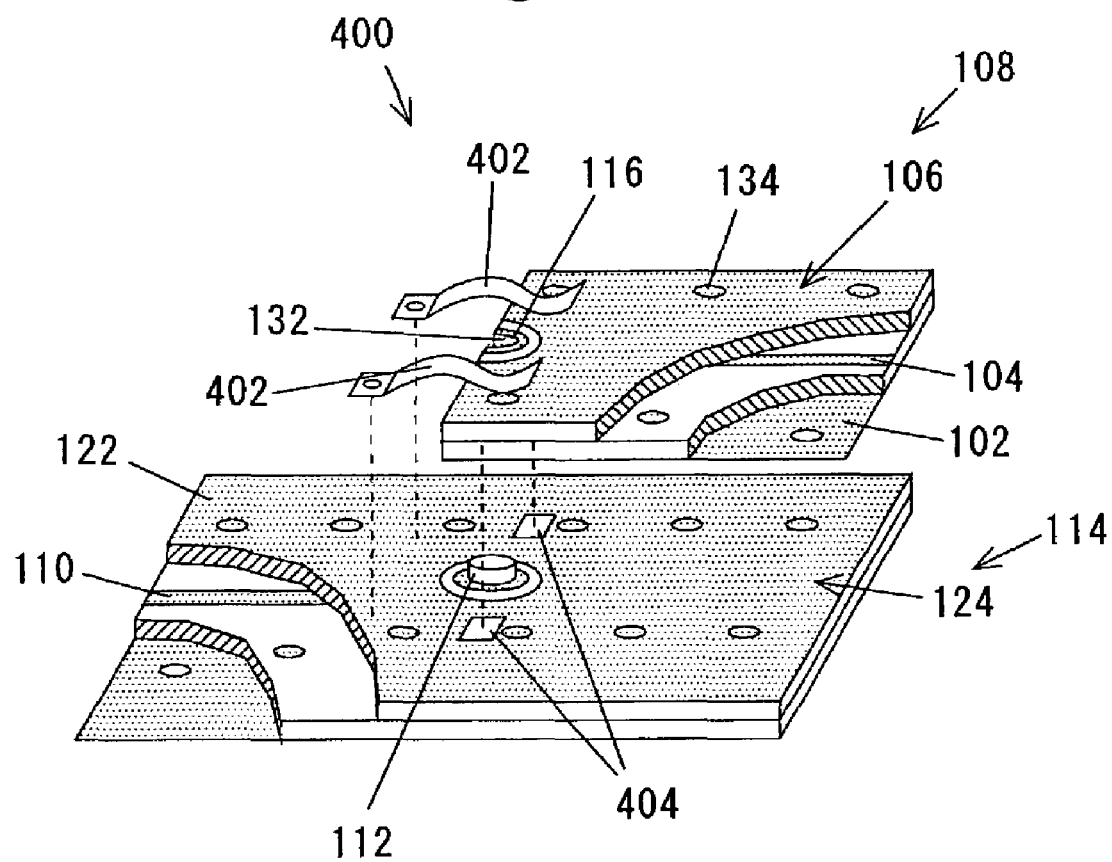
FIG. 15 is an exploded perspective view, partly broken away, of a system for interconnecting high-frequency transmission lines according to a still further embodiment of the present invention.
Figure 16:
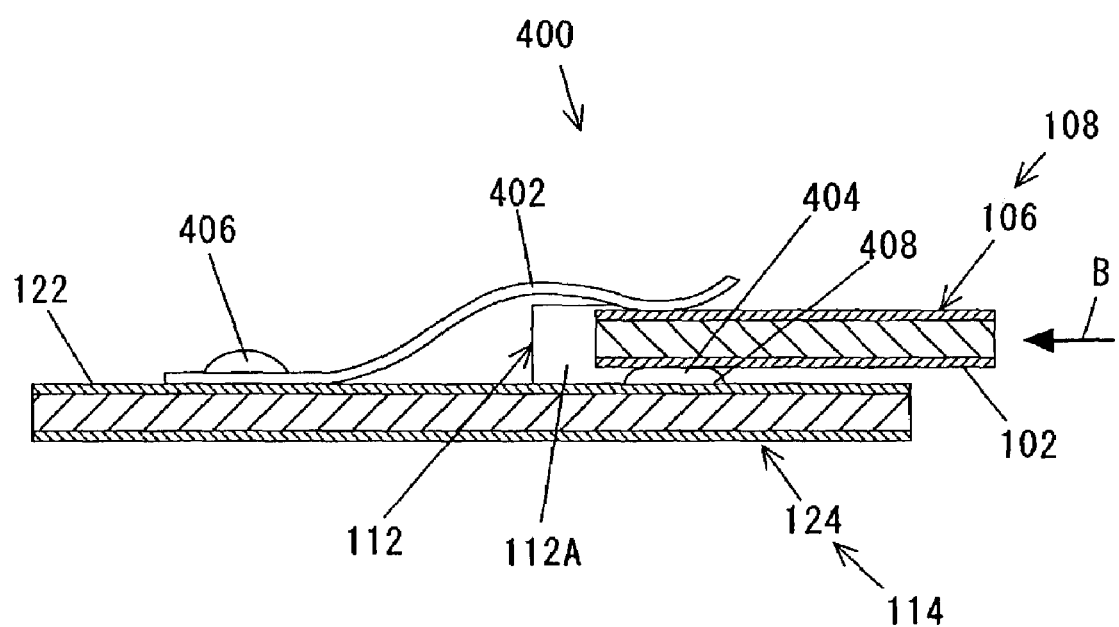
FIG. 16 is a cross-sectional view, partly omitted from illustration, of the system for interconnecting high-frequency transmission lines shown in FIG. 15.

FIG. 15 shows in exploded perspective, partly broken away, a system 400 for interconnecting high-frequency transmission lines according to a still further embodiment of the present invention, and FIG. 16 shows in cross section, partly omitted from illustration, of the system 400 for interconnecting high-frequency transmission lines shown in FIG. 15.

The system 400 basically comprises the first transmission line 108 and the second transmission line 114 shown in FIG. 1, and additionally has two wavy springs 402 serving as pressing fittings and having ends connected to the ground pattern 122 of the multilayer circuit board 124 by solder bodies 406. The springs 402 should preferably be made of a highly elastic and corrosion-resistant material such as phosphor bronze. The springs 402 may be fastened to the multilayer circuit board 124 by bolts and nuts, rather than the solder bodies 406.

Bumps 404 for reducing contact resistance are disposed between the ground pattern 102 of the multilayer circuit board 106 as the first transmission line 108 and a contact surface 408, confronting the ground pattern 102, of the ground pattern 122 of the multilayer circuit board 124 as the second transmission line 114. The bumps 404 are positioned both side the electrode 112 (see also FIG. 15).

With the system 400 shown in FIGS. 15, 16, the multilayer circuit board 124, for example, is fixed in place, and the multilayer circuit board 106 is slid along the ground pattern 122 of the multilayer circuit board 124 in the direction indicated by the arrow B in FIG. 16 until the inner wall 132 of the cut via 116 abuts against the head 112A of the electrode 112, and then remains forced in the direction indicated by the arrow B by an elastic member (not shown). Thus, the confronting ground patterns 102, 122 of the multilayer circuit boards 106, 124 are electrically connected to each other under the downward force applied by the springs 402.

The bumps 404 allow the ground patterns 102, 122 to be held in reliable contact with each other at a position desirable at high frequencies, thus reducing contact resistance therebetween.

The bumps 404 should preferably be positioned near the electrode 112 for maintaining an electrically stable connection.

The bumps 404 may be provided on either one of the upper and lower multilayer circuit boards 106, 124 or both of the upper and lower multilayer circuit boards 106, 124.

Figure 17:
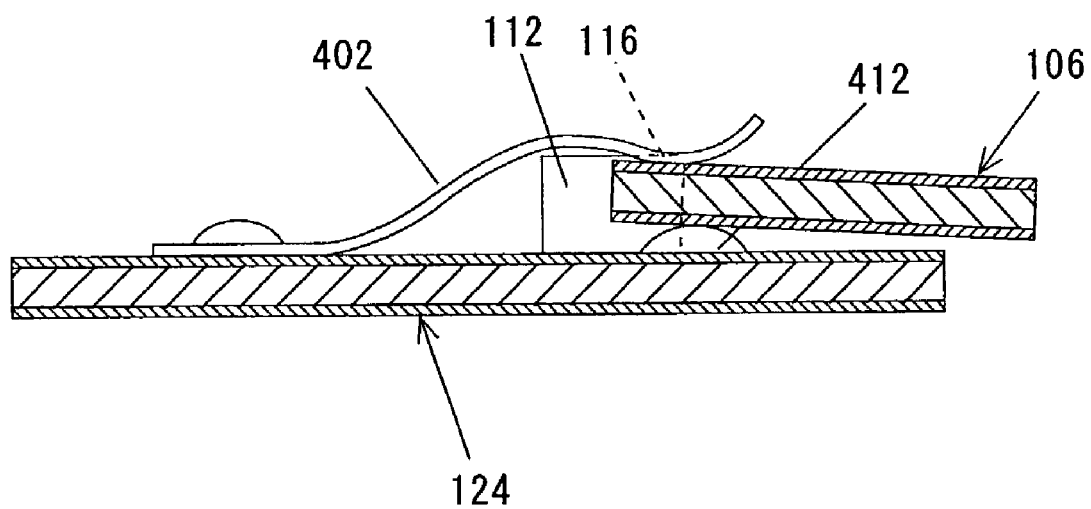
FIG. 17 is a cross-sectional view illustrative of a shortcoming caused by a bump which is excessively protrusive.

As shown in FIG. 17, if excessively protrusive bumps 412 are employed, then the connection between the electrode 112 and the cut via 116 may possible become unstable. Therefore, the bumps should preferably be not too protrusive.

As shown in FIG. 16, with the connection structure having the mechanism for pressing the multilayer circuit board 106 downwardly with the springs 402, each time the multilayer circuit board 106 is inserted in the direction indicated by the arrow B, an oxide film formed on the surface of the ground pattern 102 of the multilayer circuit board 106 is shaved off by the bumps 404, and the surfaces of the bumps 404 are rubbed by the ground pattern 102, providing a refreshing effect. Therefore, the contact areas are kept fresh at all times, so that the small contact resistance can stably be maintained between the upper and lower multilayer circuit boards 106, 124.

Figure 18:
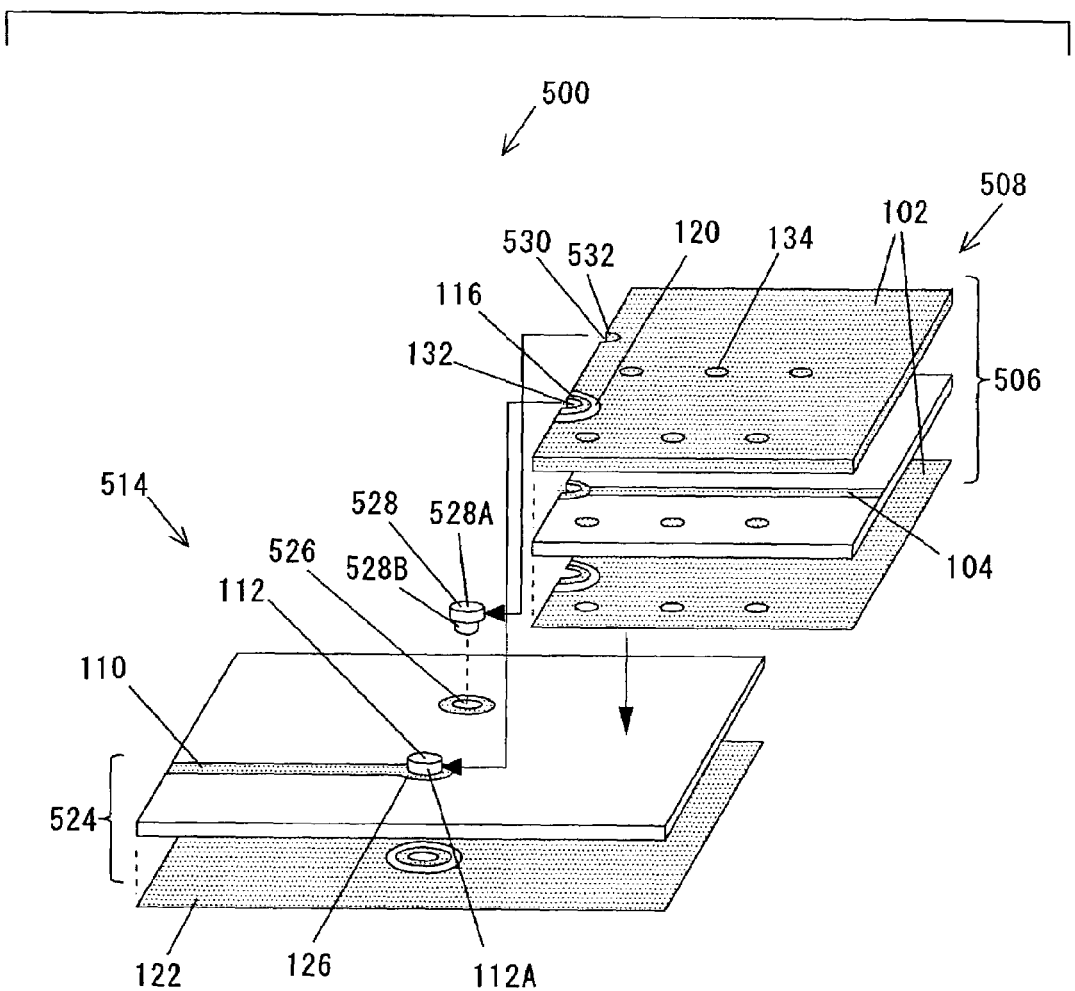
FIG. 18 is an exploded perspective view of a system for interconnecting high-frequency transmission lines according to a yet further embodiment of the present invention.
Figure 19:
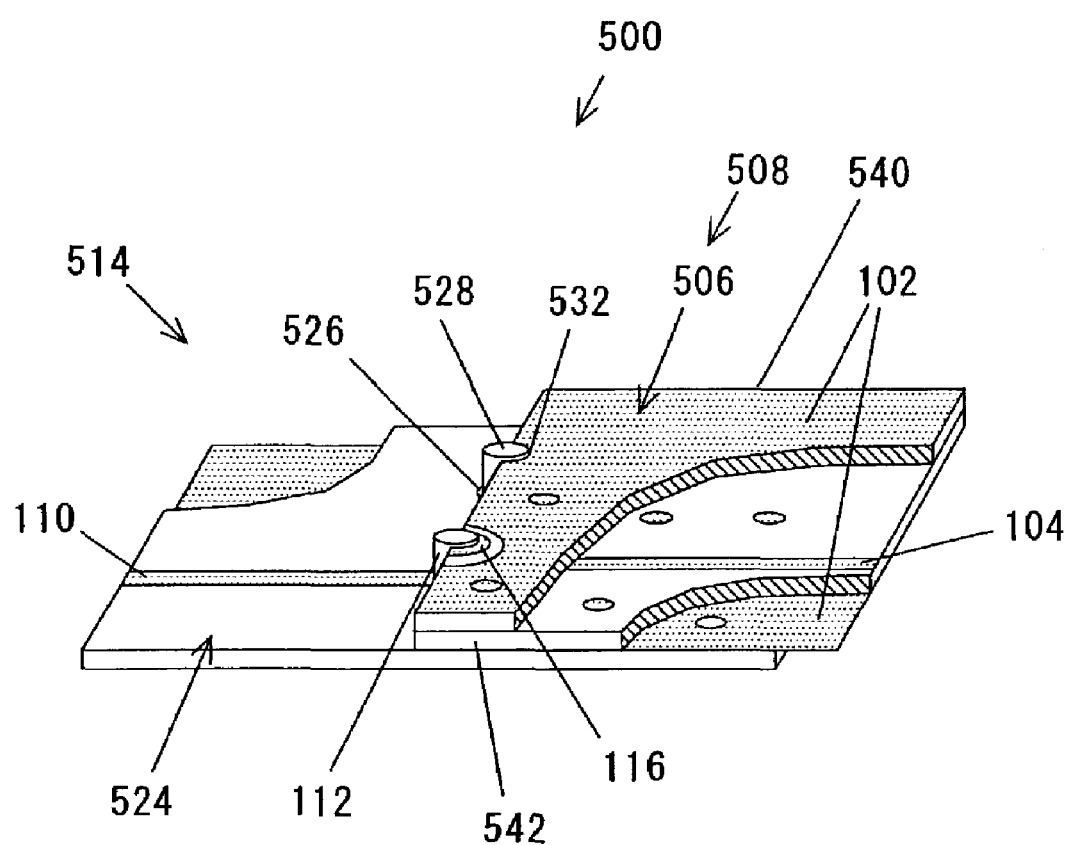
FIG. 19 is a perspective view, partly broken away, of a portion of the system for interconnecting high-frequency transmission lines shown in FIG. 18.

FIG. 18 shows in exploded perspective a system 500 for interconnecting high-frequency transmission lines according to a yet further embodiment of the present invention, and FIG. 19 shows in perspective view, partly broken away, a portion of the system 500 for interconnecting high-frequency transmission lines shown in FIG. 18.

The system 500 shown in FIGS. 18 and 19 includes a first transmission line 508 comprising a multilayer circuit board 506 which has ground patterns 102 and a first signal line 104 comprising a signal conductor, the ground patterns 102 and the first signal line 104 jointly making up a stripline, and a second transmission line 514 comprising a multilayer circuit board 524 which has a ground pattern 122 and a second signal line 110 comprising a signal conductor, the ground pattern 122 and the second signal line 110 jointly making up a microstrip line.

With the system 500 shown in FIGS. 18 and 19, the first signal line 104 and the second signal line 110 can electrically be connected to each other by the cut via 116 defined in respective ends thereof and an electrode 112 inserted and fixed in a via hole 126.

However, since the second transmission line 514 is a microstrip line, the lower ground pattern 102 of the multilayer circuit board 506 of the first transmission line 508 and the lower ground pattern 122 of the second transmission line 514 cannot be directly connected to each other using the springs 402 of the system 400 shown in FIG. 15.

According to the embodiment shown in FIGS. 18 and 19, the ground pattern 122 of the multilayer circuit board 524 of the second transmission line 514 has a ground via hole 526, and a shank 528B of a ground terminal post 528 which are of the same material and shape as the electrode 112 is inserted into the ground via hole 526, and connected thereto by soldering or the like. Though the ground terminal post 528 may not be of the same material and shape as the electrode 112, the cost can be reduced if the ground terminal post 528 are of the same material and shape as the electrode 112.

The multilayer circuit board 506 of the first transmission line 508 has a ground cut via 532, which is identical with its inner wall due to no explicit lands, defined in its end where the cut via 116 is provided, the ground cut via 532 having a recess 530 complementarily in shape to the outer circumferential surface of a head 528A of the ground terminal post 528. The ground cut via 532 and the cut via 116 are isolated from each other by the clearance 120.

The multilayer circuit board 506 of the first transmission line 508 is positioned on the multilayer circuit board 524 of the second transmission line 514 such that the inner wall 132 of the cut via 116 faces and contacts a portion of the outer circumferential surface of the head 112A of the electrode 112. Thereafter, the electrode 112 and the inner wall 132, i.e., the cut via 116, are held in contact with and connected to each other.

At the same time, the multilayer circuit board 506 of the first transmission line 508 is also positioned such that the recess 530 of the ground cut via 532 faces and contacts a portion of the outer circumferential surface of the head 528A of the ground terminal post 528. Thereafter, the ground terminal 528 and the ground cut via 532, i.e. its inner wall, are held in contact with and connected to each other.

As shown in FIGS. 18 and 19, the system 500 with the ground terminal post 528 and the ground cut via 532 is effective for use in cases where ground patterns cannot directly be connected to each other, e.g., in interconnecting the first transmission line 508 as a stripline and the second transmission line 514 as a microstrip line.

The ground terminal post 528 and the ground cut via 532 are positioned on one side of the multilayer circuit board 506 where the cut via 116 is positioned. However, the ground terminal post 528 and the ground cut via 532 may be positioned on another side 540 or 542 which extends perpendicularly to the side where the cut via 116 is positioned. In this modification, the width of the multilayer circuit board 506 needs to be smaller than the width of the multilayer circuit board 524 by a dimension required for forming the ground terminal post. The ground cut via should preferably be formed as closely to the cut via 116 connected to the signal line as possible.

Figure 20:
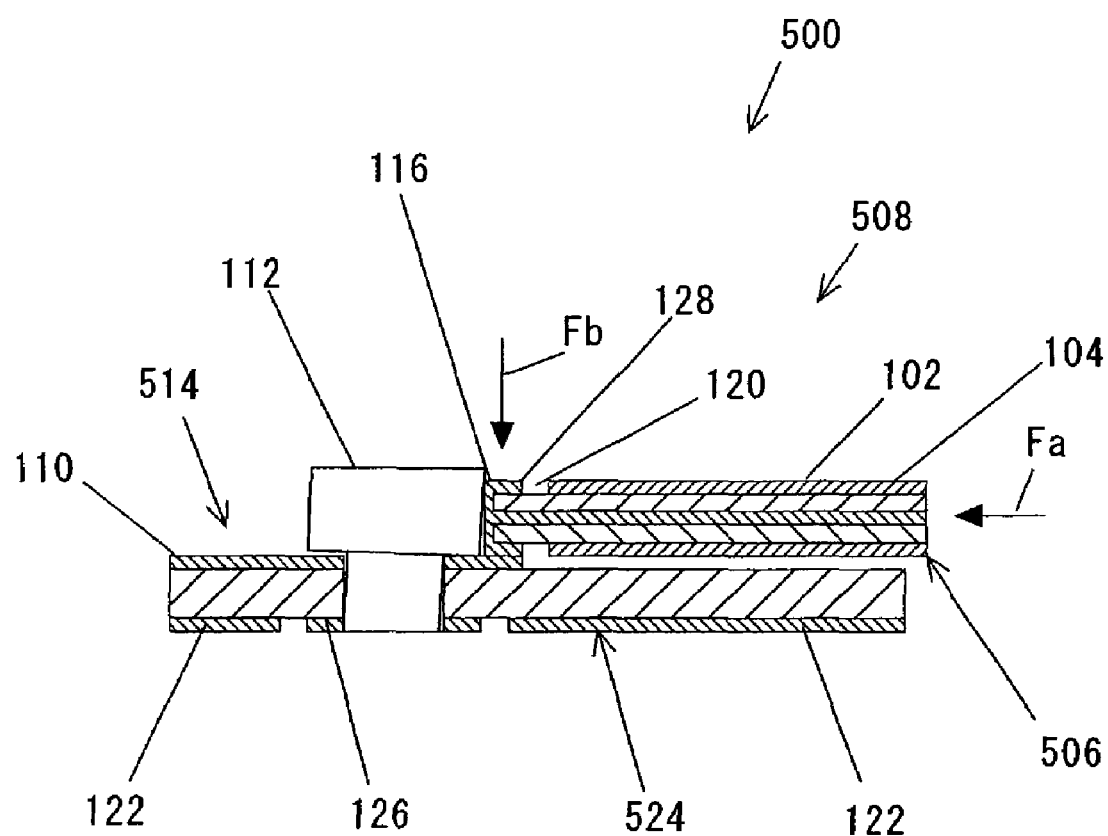
FIG. 20 is a cross-sectional view of a connection structure with an inclined electrode.

As shown in FIG. 20, if the electrode 112 is slightly inclined with its head closer to the cut via 116 and fixed in the inclined position, then a force Fa applied to press the multilayer circuit board 506 sideways produces a force Fb which simultaneously acts downwardly on the multilayer circuit board 506, thereby bringing the electrode 112 and the cut via 116 into reliable electric contact with each other. If the electrode 112 is inclined excessively, then the electric connection by a narrower edge contact between the electrode 112 and the cut via 116 will become unstable.

Figure 21:
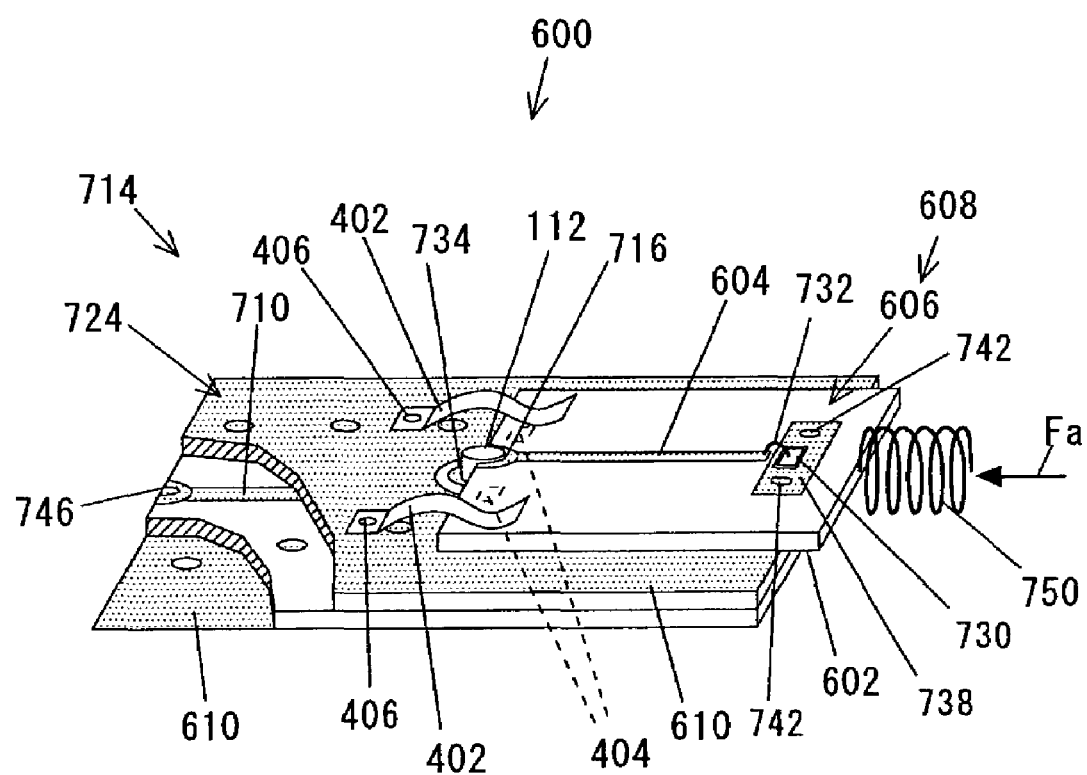
FIG. 21 is a perspective view, partly broken away, of a system for interconnecting high-frequency transmission lines according to a yet still further embodiment of the present invention.

FIG. 21 shows in exploded perspective, partly broken away, a system 600 for interconnecting high-frequency transmission lines according to a yet still further embodiment of the present invention.

The system 600 shown in FIG. 21 includes a first transmission line 608 comprising a multilayer circuit board 606 which has a reverse side ground pattern 602, a top side ground pattern 738 comprising a ground mounting pad for a measuring object, and a first signal line 604 comprising a signal transmission conductor, the ground pattern 602 and the first signal line 604 jointly making up a microstrip line, and a second transmission line 714 comprising a multilayer circuit board 724 which has ground patterns 610 and a second signal line 710 comprising a signal transmission conductor, the ground patterns 610 and the second signal line 710 jointly making up a stripline.

A test device 730 such as an integrated circuit or the like is soldered or glued to be mounted face up on the ground pattern 738 connected to the ground pattern 602 by via holes 742, and connected to an end of the first signal line 604 by a gold wire 732, and a cut via 716 is defined in the other end of the first signal line 604.

A via hole 734 for receiving an electrode 112 inserted and fixed therein is defined in an end of the second signal line 710, and a cut via 746 is defined in the other end of the second signal line 710.

Two springs 402 made of phosphor bronze or the like are fixed to the surface of the multilayer circuit board 724 by solder bodies 406 for pressing the other multilayer circuit board 606 downwardly against the multilayer circuit board 724.

Bumps 404 are disposed near the via hole 734.

A force Fa is applied to the multilayer circuit board 606 in the direction indicated by the arrow by a spring 750 which is shown as a compression coil spring in FIG. 21.

The ground patterns 602, 610 are held against and electrically connected to each other through the bumps 404 and the inner wall of the cut via 716 is held against the electrode 112 to connect the signal lines under the elastic forces of the springs 402, 750.

With the system 600 shown in FIG. 21, the springs 402 are disposed on the upper surface of the multilayer circuit board 606 for applying downward forces thereto in the vicinity of the cut via 716. Alternatively, a guide member for a vertical press force generation may be provided over the multilayer circuit board 606 and the multilayer circuit board 606 may be pressed downwardly by a coil spring or a screw combined with the guide member.

In FIG. 21, the multilayer circuit board 606 is pressed at a longitudinal end thereof by the springs 402 which comprise leaf springs. However, the multilayer circuit board 606 may be pressed at both transverse ends thereof by the springs 402 changed directionally.

Since the multilayer circuit board 606 is pressed in the vicinity of the cut via 716, the ground patterns are connected reliably to each other. As a result, the system 600 provides good high-frequency transmission characteristics.

With the system 600 according to the embodiment shown in FIG. 21, as with the embodiment shown in FIG. 16, since the bumps 404 are provided in the connection structure which has the mechanism for pressing the multilayer circuit board 606 downwardly with the springs 402, each time the multilayer circuit board 606 is inserted, an oxide film formed on the surface of the ground pattern 602 of the multilayer circuit board 606 is shaved off by the bumps 404, and the surfaces of the bumps 404 are rubbed by the ground pattern 602, providing a refreshing effect. Therefore, the contact areas are kept fresh at all times, so that the small ground contact resistance can stably be maintained between the upper and lower multilayer circuit boards 606, 724.

With the system 600 shown in FIG. 21, the spring 750 shown in the form of a compression coil spring is provided for applying the force Fa to press the end of the multilayer circuit board 606 toward the electrode 112. Alternatively, a guide member may be provided and the multilayer circuit board 606 may be pressed by the spring 750, a leaf spring, or a press screw combined with the guide member.

Insofar as the guide member is employed to press the multilayer circuit board 606 correctly toward the electrode 112, the spring 750 does not need to project downwardly, i.e., toward the multilayer circuit board 724.

In order to press the multilayer circuit board 606 easily straight toward the electrode 112, a guide mechanism may be disposed on the surface or side of the multilayer circuit board 724 for guiding the multilayer circuit board 606. The guide mechanism allows the multilayer circuit board 606 to be slid and inserted therealong, resulting in increased efficiency to connect the multilayer circuit boards 606, 724.

The arrangement shown in FIG. 21 where the test device 730 is carried on the multilayer circuit board 606 makes it simpler to replace the first transmission line 608 in the form of the multilayer circuit board 606 than the conventional connection arrangement which uses a high-frequency connector. The period of time between cycles of measuring the test device 730 can thus be reduced, and the cost of the measuring process can be reduced. The cost of the materials used can also be reduced because no high-frequency connector is used and the small first multilayer circuit board 606 only is replaced with the device 730.

Figure 22:
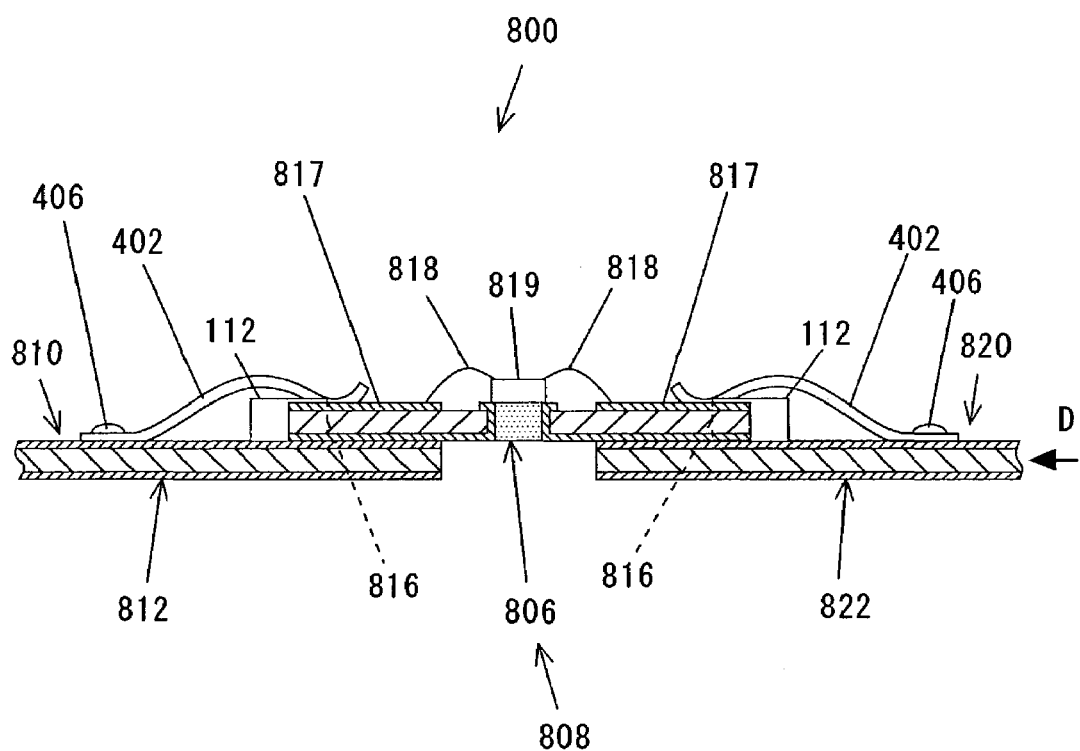
FIG. 22 is a cross-sectional view, partly omitted from illustration, of a system for interconnecting high-frequency transmission lines according to still another embodiment of the present invention.

FIG. 22 shows in cross section, partly omitted from illustration, a system 800 for interconnecting high-frequency transmission lines according to still another embodiment of the present invention.

In the system 800 shown in FIG. 22, a test device 819 is mounted face up on a ground pattern on the surface of a multilayer circuit board 806 which serves as a first transmission line 808, and is connected to a signal conductor 817 by a gold wire 818.

With the system 800 shown in FIG. 22, a signal is inputted from a second transmission line 810 comprising a multilayer circuit board 812, and supplied to the test device 819 through an electrode 112, a cut via 816, the signal conductor 817, and the gold wire 818. An output signal from the test device 819 is transmitted to a third transmission line 820 comprising a multilayer circuit board 822 through the gold wire 818, the signal conductor 817, a cut via 816, and an electrode 112.

If power supply voltages and/or a bias voltage need to be supplied to the test device 819, then the voltages can be supplied through external pin probes to pads of the test device 819.

For connecting the first, second, and third transmission lines 808, 810, 820 in cascade, the second transmission line 810 is fixed in position, and the first and third transmission lines 808, 820 are made movable. A guide mechanism is provided on each of the sides of the multilayer circuit boards 806, 822. First, the first transmission line 808 is slid with respect to the second transmission line 810 in the direction indicated by the arrow D, and then connected to the second transmission line 810. Then, the third transmission line 820 is slid with respect to the first transmission line 808 in the direction indicated by the arrow D, and then connected to the first transmission line 808. Therefore, the first and third transmission lines 808, 820 can smoothly be pressed straight without wobbling movements, providing a stable signal line connection between the first, second, and third transmission lines 808, 810, 820.

Actually, by simply applying an elastic force in the direction indicated by the arrow D, the above connecting sequence can be performed.

Alternatively, the first transmission line 808 may have its output terminal at first tied up rigidly to the third transmission line 820, thus providing an assembly. Then, the input terminal of the first transmission line 808 of the assembly may be connected to the second transmission line 810.

In FIG. 22, the first transmission line 808 is elastically pressed against the second and third transmission lines 810, 820 by the springs 402 that are fixed in position by solder bodies 406, thus connecting the ground patterns reliably.

With the system 800 shown in FIG. 22, the first, second, and third transmission lines 808, 810, 820 can easily be connected in cascade, and a good impedance matching can be achieved between the input and output terminals of the first transmission line 808 for accurately evaluating the high-frequency characteristics of the test device 819.

As the first transmission line 808 can easily be replaced, the period of time required for preparatory actions before and after the test device 819 is measured at high frequencies can be shortened. Consequently, the cost of the measuring process can be reduced.

For connecting the first, second, and third transmission lines 808, 810, 820 in cascade, no high-frequency connector is required in the joint as with the conventional system. The first transmission line 808 can be constructed as the multilayer circuit board 806 which has a relatively small area. Therefore, the cost of the materials used can be reduced.

The system 800 shown in FIG. 22 can thus be used to evaluate a large number of test devices 819 easily within a short period of time.

The system 800 has been described with respect to the cascaded connection of the first, second, and third transmission lines 808, 810, 820. However, the principles of the system 800 may be used to connect more than three transmission lines in cascade.

In the systems for interconnecting high-frequency transmission lines according to the above embodiments, a triplate stripline has been described as comprising a multilayer circuit board which is a printed circuit board having three conductive layers, and a doublet microstrip line has been described as comprising a multilayer circuit board having two conductive layers. However, a multilayer circuit board having more layers than three or two layers may be used insofar as it has a triplate or doublet structure.

The multilayer circuit board is not limited to a board having a dielectric layer made of a synthetic resin, but may comprise a high-frequency circuit substrate used in high speed integrated circuit mountings, such as a ceramic substrate, a silicon wafer, or the like.

The coaxial cable is not limited to a semirigid cable as described above, but may be a flexible coaxial cable or an air-spaced coaxial tube type cable.

In the above embodiments, a single signal line is provided by the coaxial cable or on the multilayer circuit board. However, the present invention is also applicable to a structure for connecting two or more signal lines using respective cut vias and electrodes corresponding to the signal lines.

The transmission lines are connected co-lineally in cascade in the illustrated embodiments. However, the transmission lines may be connected in cascade in different directions.

According to the present invention, as described above, it is possible to achieve a good impedance matching at a joint of transmission lines in a wide frequency range.

It is also possible to provide a highly reproducible stable connecting technique (fixing technique) which is effective for making connections for use in a frequency range in excess of 10 GHz.

It is further possible to provide a strong mechanical connection.

It is also possible to interconnect high-frequency transmission lines inexpensively, simply, accurately and highly characteristically.

Although certain preferred embodiments of the present invention have been shown and described in detail, it should be understood that various changes and modifications may be made therein without departing from the scope of the appended claims.

What is claimed is:

1. A system for electrically interconnecting high-frequency transmission lines, comprising:
    a first transmission line comprising a multilayer circuit board having a ground pattern and a first signal line which jointly make up a stripline or a microstrip line; and
    a second transmission line having a second signal line and an electrode electrically connected to the second signal line;
    said first transmission line having a cut via defined in an end thereof and connected to said first signal line of said stripline or said microstrip line, said cut via formed by cutting a via hole;
    said first transmission line having a clearance defined between said cut via and said ground pattern for providing an impedance matching between characteristic impedances of said first and second transmission lines;
    said cut via of said first transmission line and said electrode of said second transmission line being connected to each other, said first and second transmission lines having ground conductors connected to each other,
    wherein said ground pattern has sleeves disposed outside of said clearance and spaced a distance from each other and extending outwardly with said cut via disposed therebetween, and
    wherein said second transmission line comprises a coaxial cable having an outer conductor and a central conductor disposed therein as said second signal line, said distance being provided by a gap corresponding to the diameter of said outer conductor to hold said outer conductor between said sleeves, said central conductor having a bare wire strip serving as said electrode, said outer conductor being inserted in the gap between said sleeves and connected to said sleeves, said bare wire strip of said central conductor being connected to said cut via.

2. A system according to claim 1, further comprising two conductive fittings interconnecting the outer conductor of said coaxial cable and the ground pattern of said first transmission line, said conductive fittings being disposed respectively on upper and lower sides of said first transmission line and pressed against and held in contact with respective portions of said outer conductor, and being connected to the ground pattern of said first transmission line.

* * * * *